United States Patent
Kawasaki et al.

(10) Patent No.: US 8,384,466 B2
(45) Date of Patent: Feb. 26, 2013

(54) SEMICONDUCTOR DEVICE

(75) Inventors: Toshiaki Kawasaki, Osaka (JP); Yasuhiro Agata, Osaka (JP); Masanori Shirahama, Shiga (JP); Toshihiro Kougami, Kyoto (JP); Katsuya Arai, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/417,548

(22) Filed: Mar. 12, 2012

(65) Prior Publication Data

US 2012/0169402 A1 Jul. 5, 2012

Related U.S. Application Data

(63) Continuation of application No. PCT/JP2010/006288, filed on Oct. 22, 2010.

(30) Foreign Application Priority Data

Oct. 29, 2009 (JP) ................................ 2009-248930

(51) Int. Cl.
*H01H 37/76* (2006.01)

(52) U.S. Cl. ...................................... 327/525
(58) Field of Classification Search .................... 327/525
See application file for complete search history.

(56) References Cited

U.S. PATENT DOCUMENTS

| 6,404,017 | B1 | 6/2002 | Takizawa et al. |
| 6,710,640 | B1 * | 3/2004 | Kothandaraman et al. ... 327/525 |
| 7,432,755 | B1 * | 10/2008 | Park et al. .................. 327/525 |
| 2004/0196601 | A1 | 10/2004 | Shim |
| 2005/0133839 | A1 | 6/2005 | Okushima |
| 2006/0083046 | A1 | 4/2006 | Agata et al. |
| 2007/0262414 | A1 | 11/2007 | Ueda |
| 2008/0150613 | A1 | 6/2008 | Agata et al. |
| 2009/0189226 | A1 | 7/2009 | Yamamoto et al. |
| 2010/0037454 | A1 | 2/2010 | Ueda |

FOREIGN PATENT DOCUMENTS

| JP | 2001-189428 | 7/2001 |
| JP | 2004-311981 | 11/2004 |
| JP | 2005-183661 | 7/2005 |
| JP | 2006-114804 | 4/2006 |
| JP | 2007-305693 | 11/2007 |
| JP | 2008-153588 | 7/2008 |
| JP | 2009-177044 | 8/2009 |

OTHER PUBLICATIONS

International Search Report of PCT Application No. PCT/JP2010/006288 dated on Jan. 18, 2011.

* cited by examiner

*Primary Examiner* — Jeffrey Zweizig
(74) *Attorney, Agent, or Firm* — Panasonic Patent Center

(57) ABSTRACT

A semiconductor device includes an electric fuse circuit and a program protective circuit. The electric fuse circuit includes a fuse element and a transistor connected together in series and placed between a program power supply and a grounding, and controlling sections. The program protective circuit is placed in parallel with the electric fuse circuit and between the program power supply and the grounding. When a surge voltage is applied between the program power supply and the grounding, the foregoing structure allows a part of a surge electric current can flow through the program protective circuit.

27 Claims, 24 Drawing Sheets

SEMICONDUCTOR DEVICE

BACKGROUND

1. Technical Field

The present invention relates to a semiconductor device including an electric fuse circuit.

2. Background Art

An electric fuse has been used as a programmed device working as a redundant device for failure relief in a semiconductor device such as a system LSI. The programmed electric fuse allows a great enough electric current to run through a fuse element thereof so that a part of the fuse element can be broken for, and the fuse element is thus changed from a low resistance member to a great resistance member.

"Unexamined Japanese Patent Application Publication No. 2006-114804" discloses an instance of an electric fuse circuit including a fuse element and its operation. "Unexamined Japanese Patent Application Publication No. 2008-153588" discloses an electric fuse circuit that can avoid programming erroneously the fuse element in the case of turning on or off the power supply of the system LSI, or in the case of a partial cut-off of the power supply or a grounding, or in the case of restoring the cut-off state to a normal state.

SUMMARY

In recent years, the measure against ESD (electrostatic discharge) has become a critical issue for digital products. To be more specific, the ESD causes applying a surge voltage between the power supply and the grounding in an assembling process where a system LSI is integrated into a set-product or in an inspection process of chips. This surge voltage allows a large amount of transient current to run there. When a program power-supply for programming a fuse element generates a surge current, a large amount of electric current runs through the fuse element of the electric fuse circuit in a semiconductor device, whereby the fuse element can be programmed erroneously.

The present invention aims to avoid programming the fuse element erroneously even if a surge voltage is applied from a program power supply to a semiconductor device including an electric fuse circuit.

One aspect of the present invention provides a semiconductor device comprising:

an electric fuse circuit including:
a fuse element and a transistor connected together in series and disposed between a program power supply and a grounding,
a controller for controlling a gate potential of the transistor; and
a program preventive circuit disposed in parallel with the electric fuse circuit and between the program power-supply and the grounding for allowing a part of a surge current to flow therein when a surge voltage is applied between the program power supply and the grounding.

According to the foregoing aspect, the program preventive circuit is disposed between the program power supply and the grounding and in parallel with the electric fuse circuit, and this program preventive circuit is structured such that a part of the surge current can flow in the program preventive circuit when the surge voltage is applied between the program power supply and the grounding. This structure allows distributing the surge current into the electric fuse circuit and the program preventive circuit even if the surge voltage is applied from the program power supply, so that an electric current flowing through the fuse element of the electric fuse circuit can be reduced. As a result, the fuse element can be prevented from being programmed erroneously.

The present invention thus can prevent the fuse element of the electric fuse circuit integrated in the semiconductor device from being erroneously programmed even if the program power supply generates the surge voltage.

DESCRIPTION OF EMBODIMENTS

An exemplary embodiment of the present invention is demonstrated hereinafter with reference to the accompanying drawings.

Figure 1:
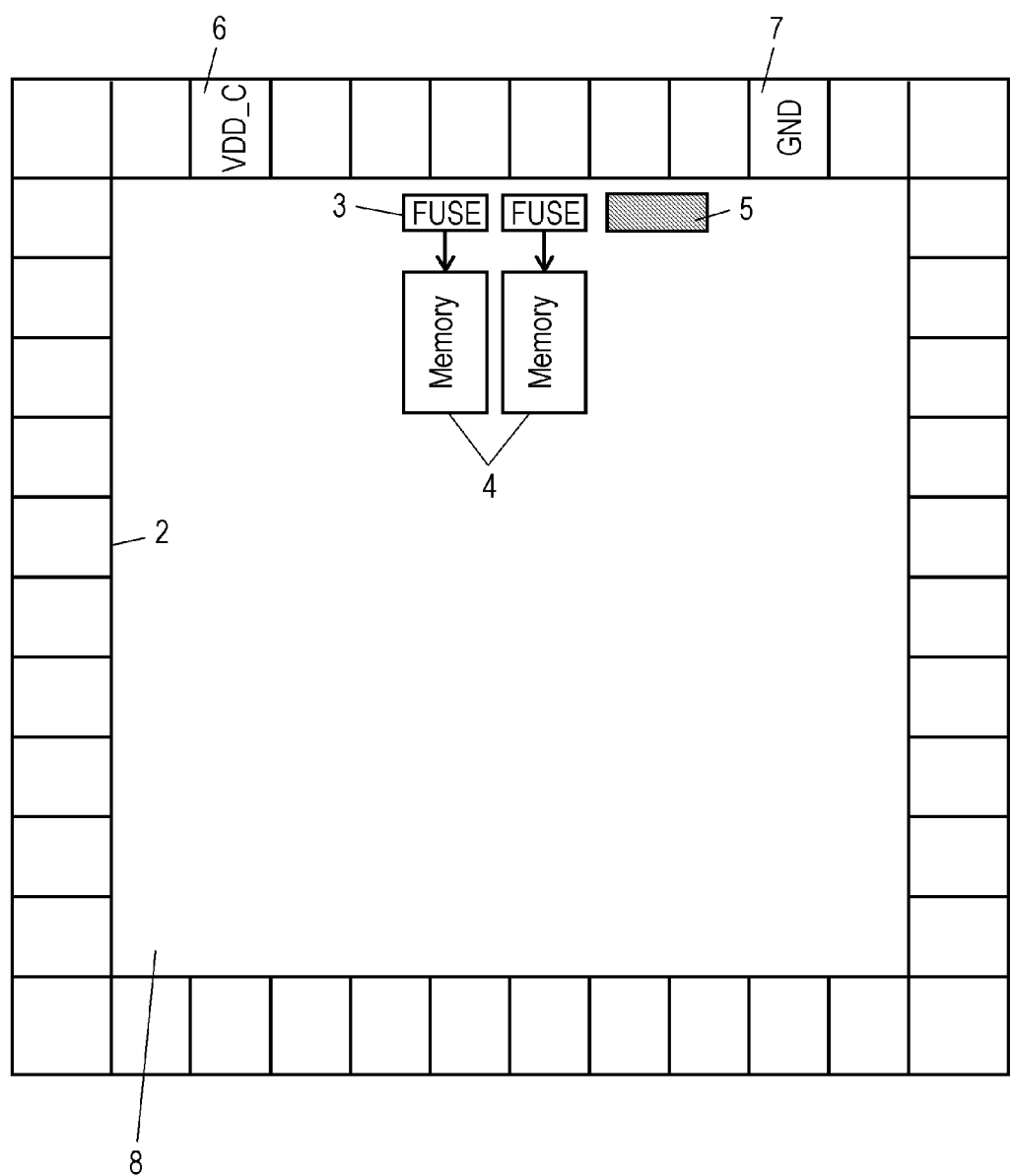
FIG. 1 is a plan view illustrating a structure of a semiconductor device in accordance with an embodiment of the present invention.

FIG. 1 is a plan view illustrating a structure of a system LSI as a semiconductor device in accordance with the embodiment. This system LSI includes IO cell region 2 in which a number of IO (input output) cells exist. This IO cell region 2 also includes other cells, e.g. a power supplying cell and a dummy cell. Program power supplying cell 6, of which supply voltage is VDD_C, and grounding cell 7, of which grounding voltage is GND, are disposed in IO cell region 2. Center region 8 inside IO cell region 2 includes logic circuits, e.g. memory circuits 4. In this paper, the region surrounded by the IO cell region disposed on a periphery of a chip is referred to as a center region. The center region is not limited to a center section of a surface region of the chip, but it includes a wider region extending from the vicinity of the IO cell region to the center section.

Electric fuse circuit 3 working as a programmed device is provided to each one of memory circuits 4, and circuit 3 works as a redundant device for failure relief. Electric fuse circuit 3 includes a fuse element disposed between a program power supply and a grounding. On top of that, program preventive circuit 5 is disposed for a part of a surge current to flow through it when a surge voltage is applied between the program power supply and the grounding. Program preventive circuit 5 is disposed in parallel with electric fuse circuit 3 between the program power supply and the grounding.

Figure 2:
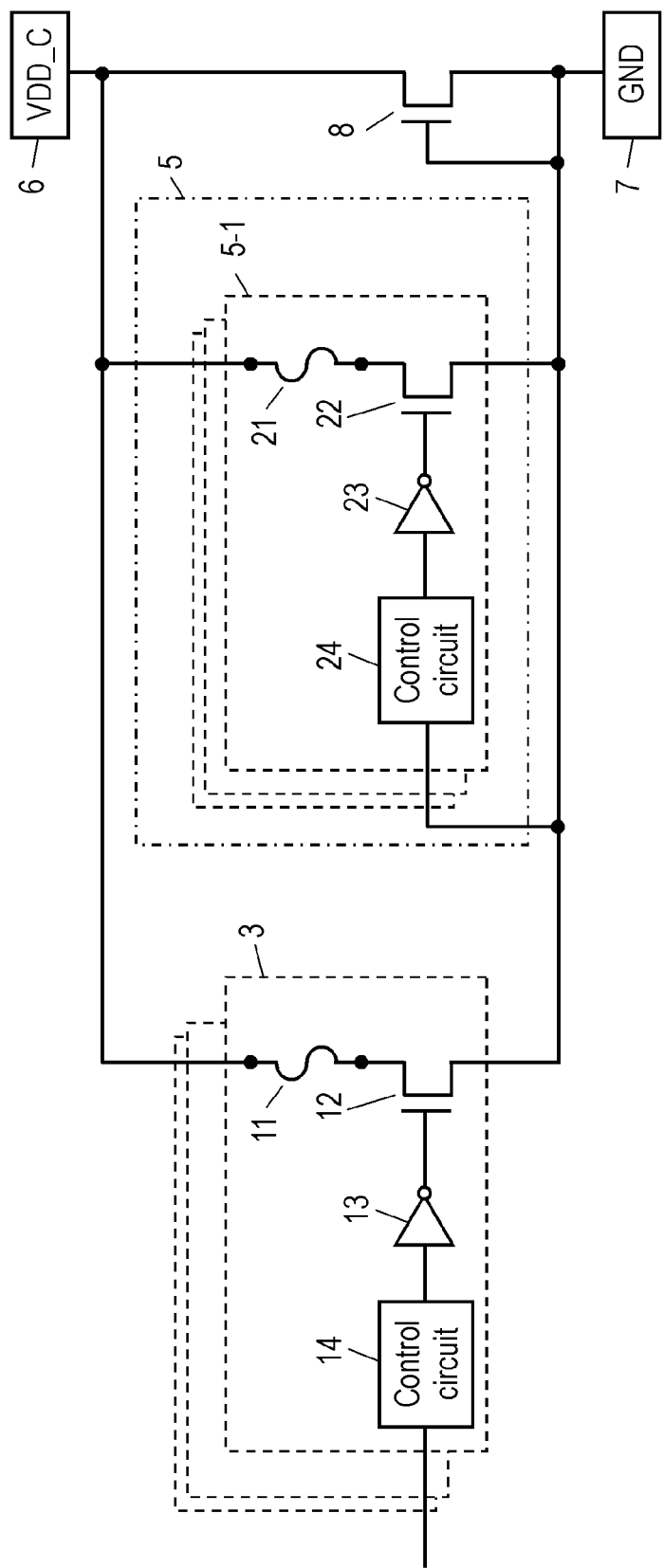
FIG. 2 shows an example of a circuit diagram including an electric fuse circuit and a program circuit shown in FIG. 1.

FIG. 2 shows a circuit diagram including electric fuse circuit 3 and program preventive circuit 5. As shown in FIG. 2, electric fuse circuit 3 comprises the following structural elements:

fuse element 11 and NMOS transistor 12 connected together in series and disposed between program power supply 6 and grounding 7;

inverter circuit 13 of which output is connected to a gate of NMOS transistor 12, and control circuit 14 for selecting fuse element 11 to be programmed.

A controlling section is formed of control circuit 14 and inverter circuit 13 for controlling a gate potential of NMOS transistor 12 in response to whether or not a programmed operation of fuse element 11 is required.

Program preventive circuit 5 includes multiple circuit units 5-1, and each one of circuit units 5-1 comprises the following structural elements:

fuse element 21, working as a second fuse element, and NMOS transistor 22, working as a second transistor, connected together in series and disposed between program power supply 6 and grounding 7:

inverter circuit 23 of which output is connected to a gate of NMOS transistor 22; and control circuit 24 having the same structure as control circuit 14.

Figure 3:
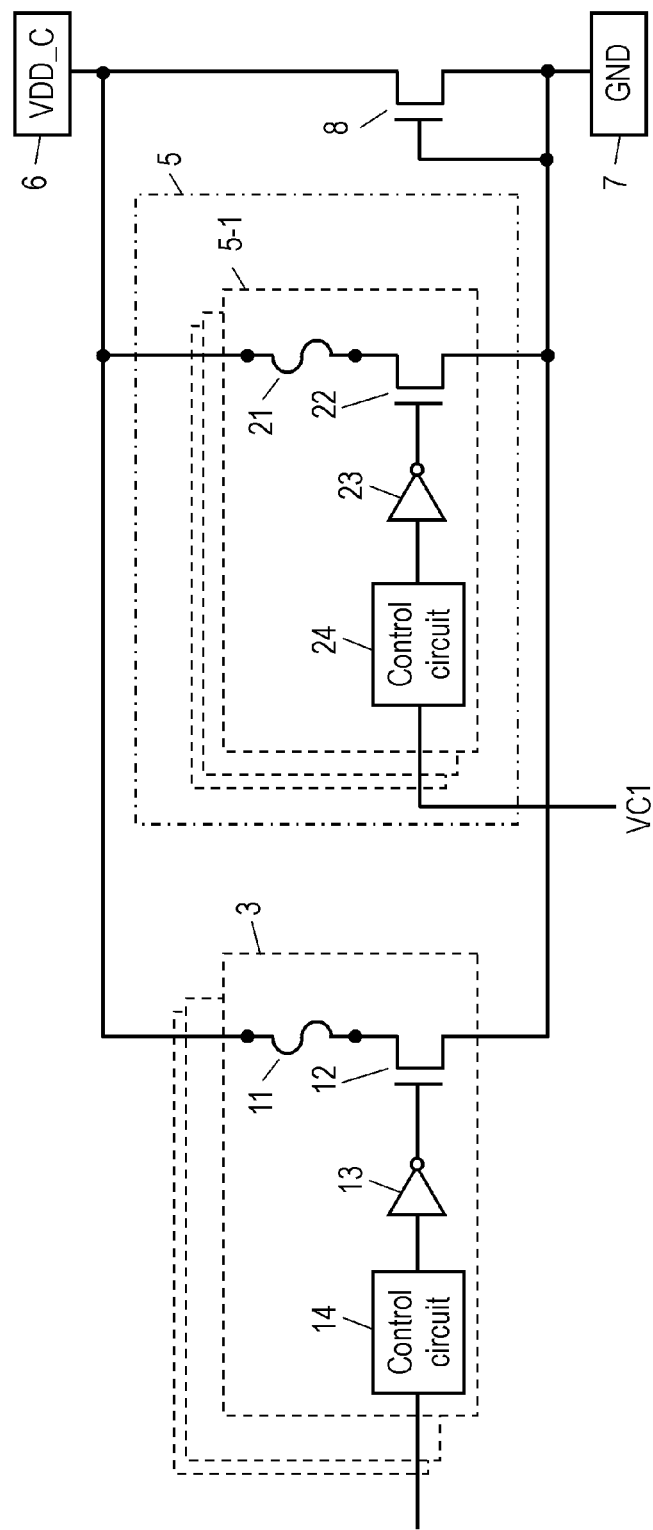
FIG. 3 shows a variation of the circuit diagram shown in FIG. 2.

A second controlling section is formed of control circuit 24 and inverter circuit 23 for controlling a gate potential of NMOS transistor 22. An input to control circuit 23 is fixed at a certain potential, e.g. a grounding potential, such that an output from inverter circuit 23 can throw NMOS transistor 22 into an off-state (non-conductive state). As shown in FIG. 3, predetermined potential VC1 is applied to control circuit 24 so that the output of inverter circuit 23 can be fixed at a potential that throws NMOS transistor 22 into the off-state.

NMOS transistor 8 for surge protection is disposed between program power supply 6 and grounding 7. Inverter circuits 13, 23 and control circuits 14, 24 are formed of logic transistors, and they are powered by the program power supply.

In the case of programming fuse element 11 shown in FIG. 2, control circuit 14 outputs a predetermined potential such that inverter circuit 13 can output a potential that throws NMOS transistor 12 into an on-state (conductive state). This action allows NMOS transistor 12 to be conductive, and an electric current runs from the program power supply to fuse element 11, whereby fuse element 11 is broken partially and a resistant value of fuse element 11 changes irreversibly. Fuse element 11 thus carries out a programmed operation. On the other hand, in the case of not programming fuse element 11, control circuit 14 fixes its output potential such that inverter circuit 13 can output a potential that maintains NMOS transistor 12 in the off-state. This action prevents fuse element 11 from being programmed erroneously.

In program preventive circuit 5, an input to control circuit 24 is fixed at a potential that maintains NMOS transistor 22 in the off-state, so that fuse element 21 cannot be programmed erroneously.

Assume that a surge voltage is applied between the program power supply and the grounding, this case allows surge-protective NMOS transistor 8 to be in an on-state, so that a surge current is discharged. However, if the gate potential of NMOS transistor 12 of electric fuse circuit 3 follows the surge voltage and then exceeds a threshold, NMOS transistor 12 is thrown into the on-state, and an electric current flows through fuse element 11. If this electric current exceeds an amount of break-start current, i.e. an electric current necessary for programming a fuse element, fuse element 11 can be erroneously programmed.

The embodiment of the present invention provides program preventive circuit 5 in parallel with electric fuse circuit 3 and between program power supply 6 and grounding 7, whereby a part of the surge current flows into program preventive circuit 5. In other words, the surge current is distributed to circuit 3 and circuit 5, so that an amount of the electric current flowing through fuse element 11 of electric fuse circuit 3 is dramatically reduced comparing with the case where no program preventive circuit 5 is available. When a surge voltage is generated, the presence of program preventive circuit 5 allows reducing the electric current flowing through fuse element 11 to an amount not exceeding the break-start current. This structure thus can prevent fuse element 11 from being broken erroneously, i.e. from being programmed erroneously.

A greater quantity of circuit units 5-1 included in program preventive circuit 5, i.e. a greater quantity of pairs of fuse element 21 and NMOS transistor 22, generates a greater effect of preventing the fuse elements from being erroneously broken. However, an excessive quantity of circuit units 5-1 is not favorable in terms of the cost or the region occupied by the circuits. The quantity of circuit units 5-1 is preferably set this way: Based on the surge application characteristics of NMOS transistor 8, when NMOS transistors 12 and 22 are turned on and electric current runs through fuse elements 11 and 21, an amount of the current running through fuse element 11 should be less than the break-start current. The inventors of the present invention have studied that a regular system LSI provided with 10 units or more than 10 units of circuit units 5-1 can prevent, without fail, the fuse element from being erroneously broken.

Figure 4:
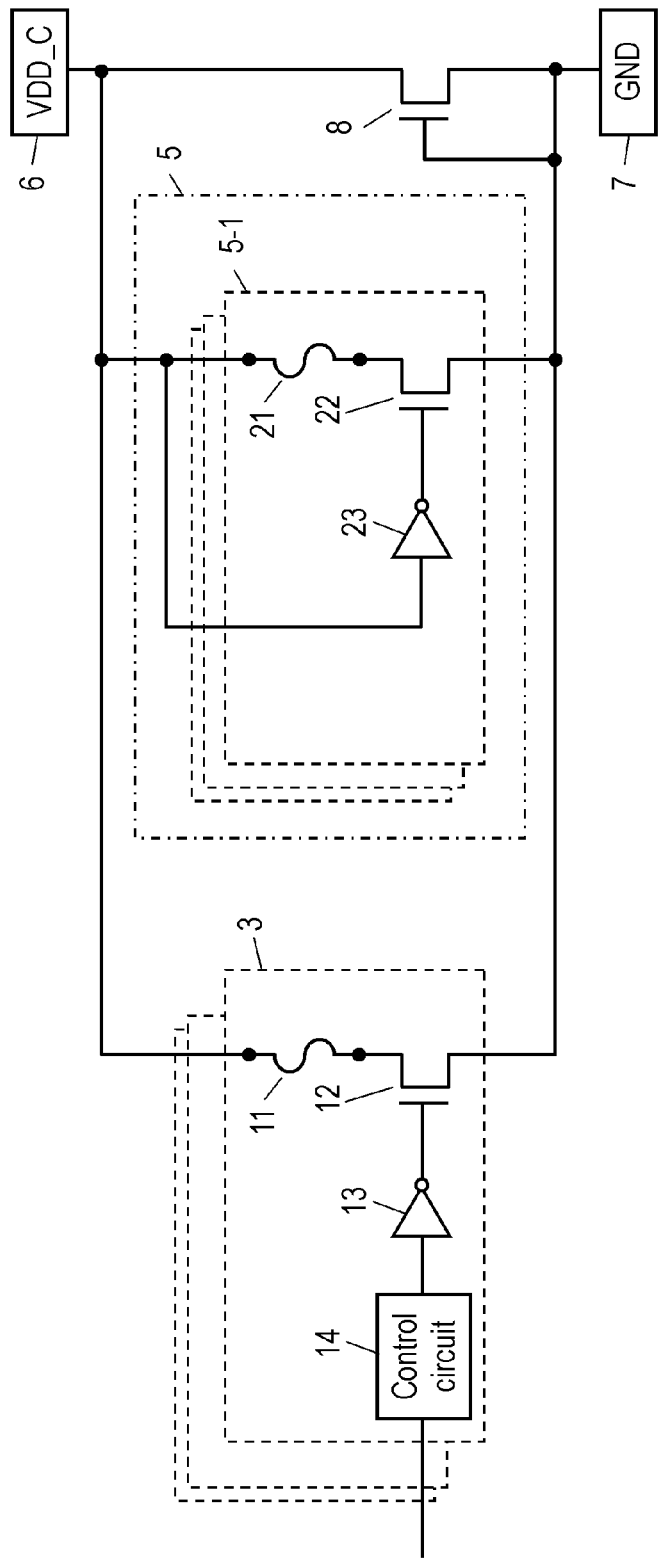
FIG. 4 shows a variation of the circuit diagram shown in FIG. 2.
Figure 5:
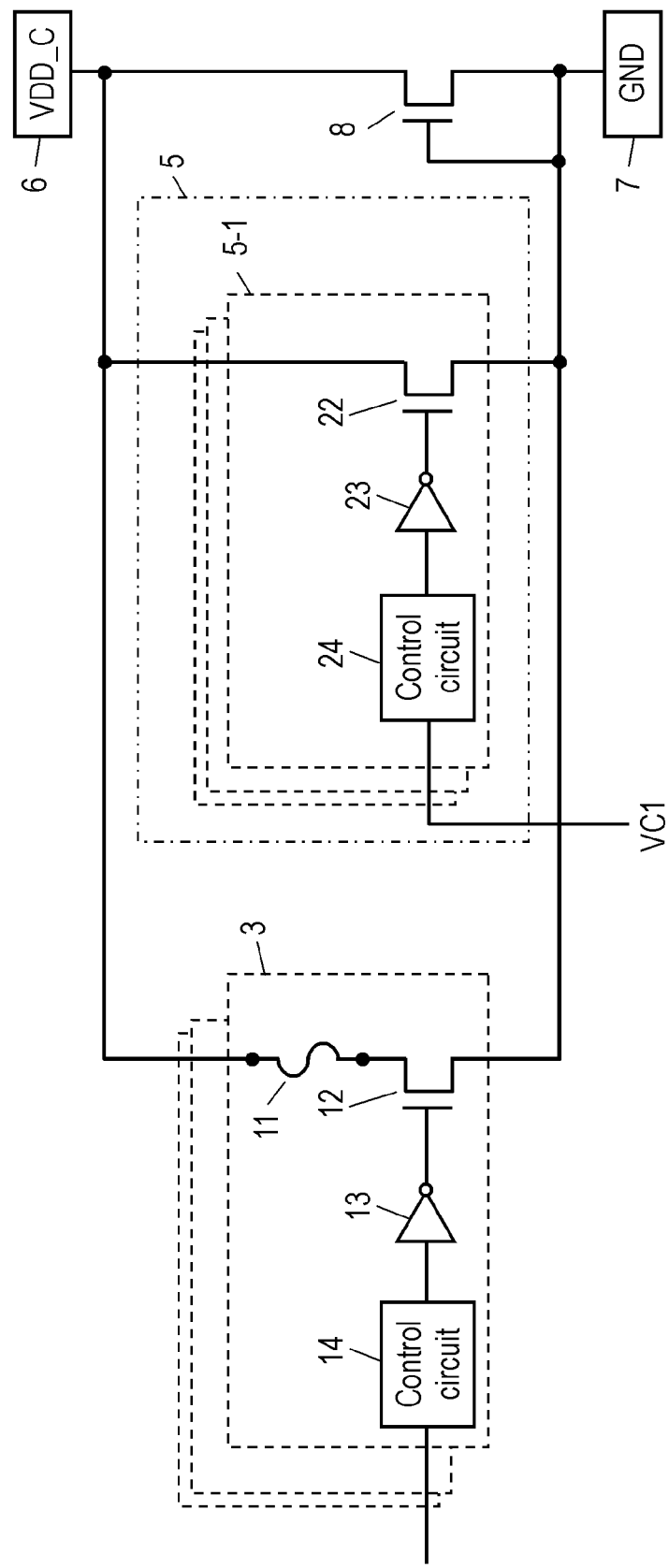
FIG. 5 shows a variation of the circuit diagram shown in FIG. 2.
Figure 6:
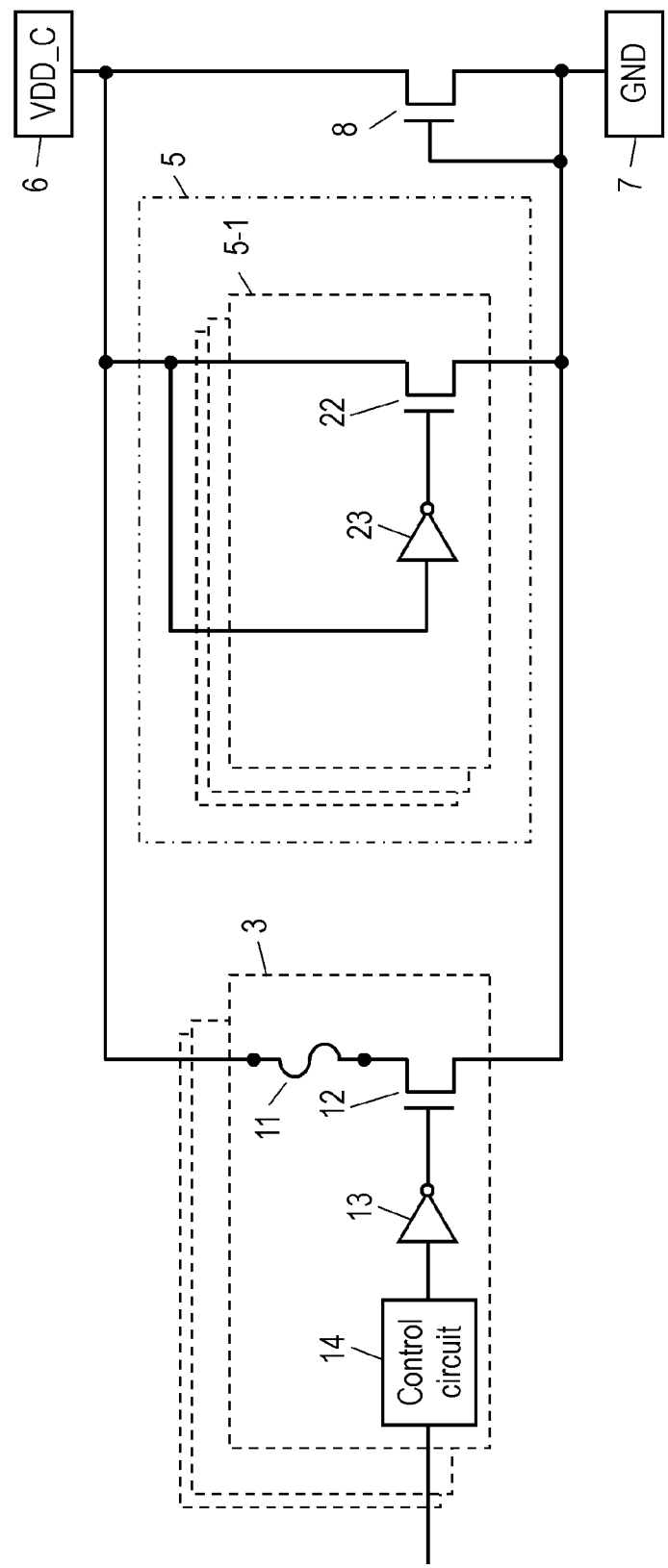
FIG. 6 shows a variation of the circuit diagram shown in FIG. 2.

FIG. 4-FIG. 6 show instances of a circuit diagram including electric fuse circuit 3 and program preventive circuit 5, and the respective drawings have different structures of circuit unit 5-1 from those shown in FIG. 2 and FIG. 3.

The structure shown in FIG. 4 omits control circuit 24 from circuit unit 5-1, and program power supply 6 supplies source voltage VDD_C to inverter circuit 23 so that a potential, which can maintain NMOS transistor 12 in an off-state, can be supplied to the gate of transistor 12. This structure allows reducing a circuit region in addition to prevention of programming when a surge voltage is applied.

The structure shown in FIG. 5 omits fuse element 21 from circuit unit 5-1. This structure also prevents the programming when the surge voltage is applied.

The structure shown in FIG. 6 omits fuse element 21 and control circuit 24 from circuit unit 5-1. Program power supply 6 supplies source voltage VDD_C to inverter circuit 23 so that a potential, which can maintain NMOS transistor 12 in the off-state, can be supplied to the gate of transistor 12.

In the structures shown in FIG. 2-FIG. 4, fuse element 21 can be replaced with another type of resistance element. In this case, a similar effect to what is discussed previously, i.e. prevention of programming at the application of the surge voltage, can be obtained.

In the structures shown in FIG. 2-FIG. 4, fuse element 11 of electric fuse circuit 3 preferably has an equal structure, including material and dimensions, to that of fuse element 21 of program preventive circuit 5. This will match device characteristics, in terms of a surge current, of fuse 11 to those of fuse 21, so that the surge current can be distributed to multi-targets without fail.

In the structures shown in FIG. 2-FIG. 6, a size of NMOS transistor 22 of program preventive circuit 5 is preferably equal to or greater than that of NMOS transistor 12 of electric fuse circuit 3. This structure allows the surge current to flow into program preventive circuit 5 without fail, so that the surge current can be positively distributed to the multi circuits.

In the circuit structures shown in FIG. 2-FIG. 6, NMOS transistor 22 of program preventive circuit 5 preferably has a threshold equal to or smaller than that of NMOS transistor 12 of electric fuse circuit 3. This structure allows the surge current to flow into program preventive circuit 5 without fail, so that the surge current can be positively distributed to the multi circuits.

In each of the circuit structures shown in FIG. 2-FIG. 6, a transistor size of inverter circuit 13 is preferably equal to that of inverter circuit 23 of program preventive circuit 5. This structure will match operation-fluctuation characteristics, in terms of application of the surge voltage, of transistor 12 to that of transistor 22, so that the surge current can be distributed positively to the multi circuits.

In the structures discussed previously, program preventive circuit 5 forms an independent circuit block of electric fuse circuit 3; however, it can be integrated in the circuit block to which the electric fuse circuit belongs.

Figure 7:
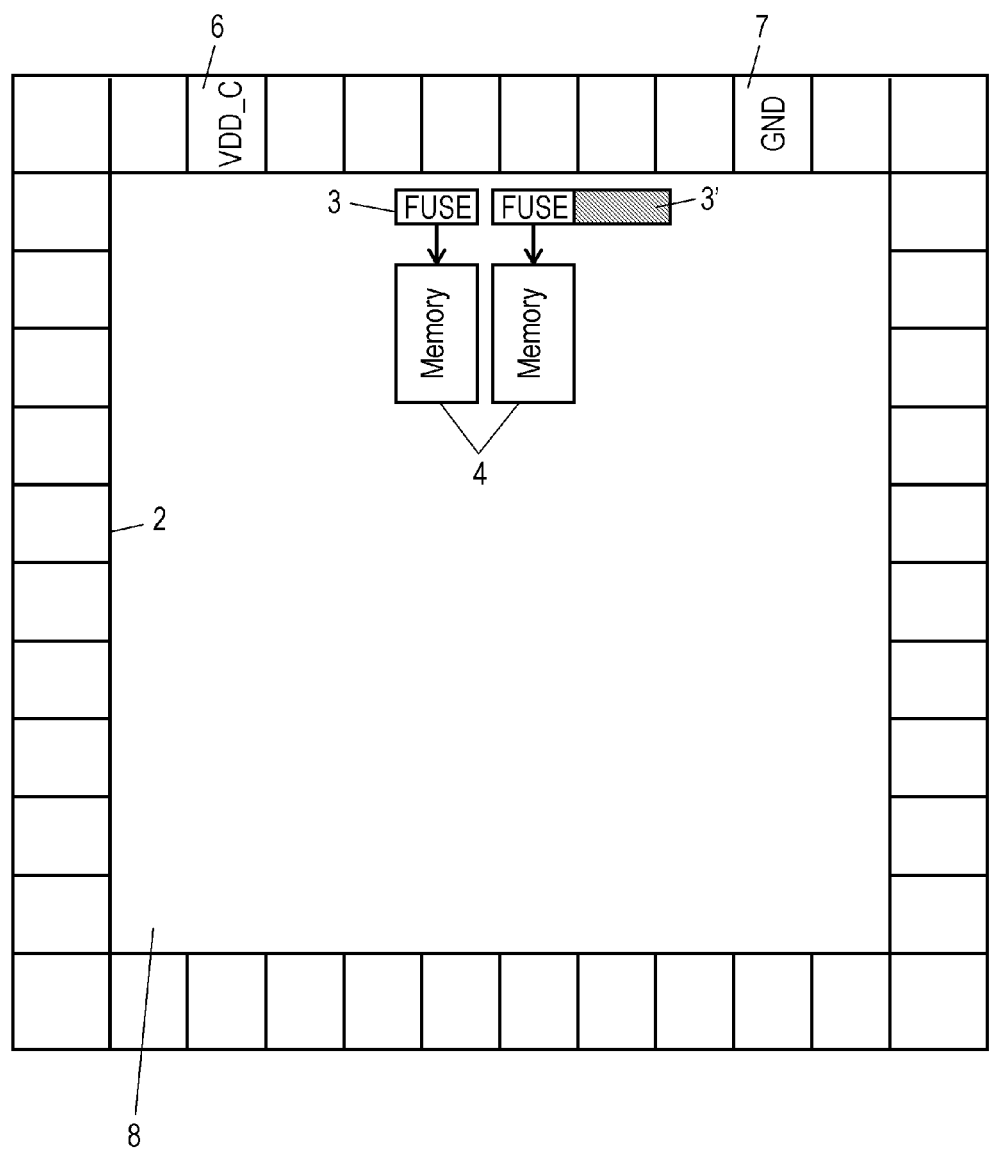
FIG. 7 is a plan view illustrating another structure of the semiconductor device in accordance with the embodiment of the present invention.
Figure 8:
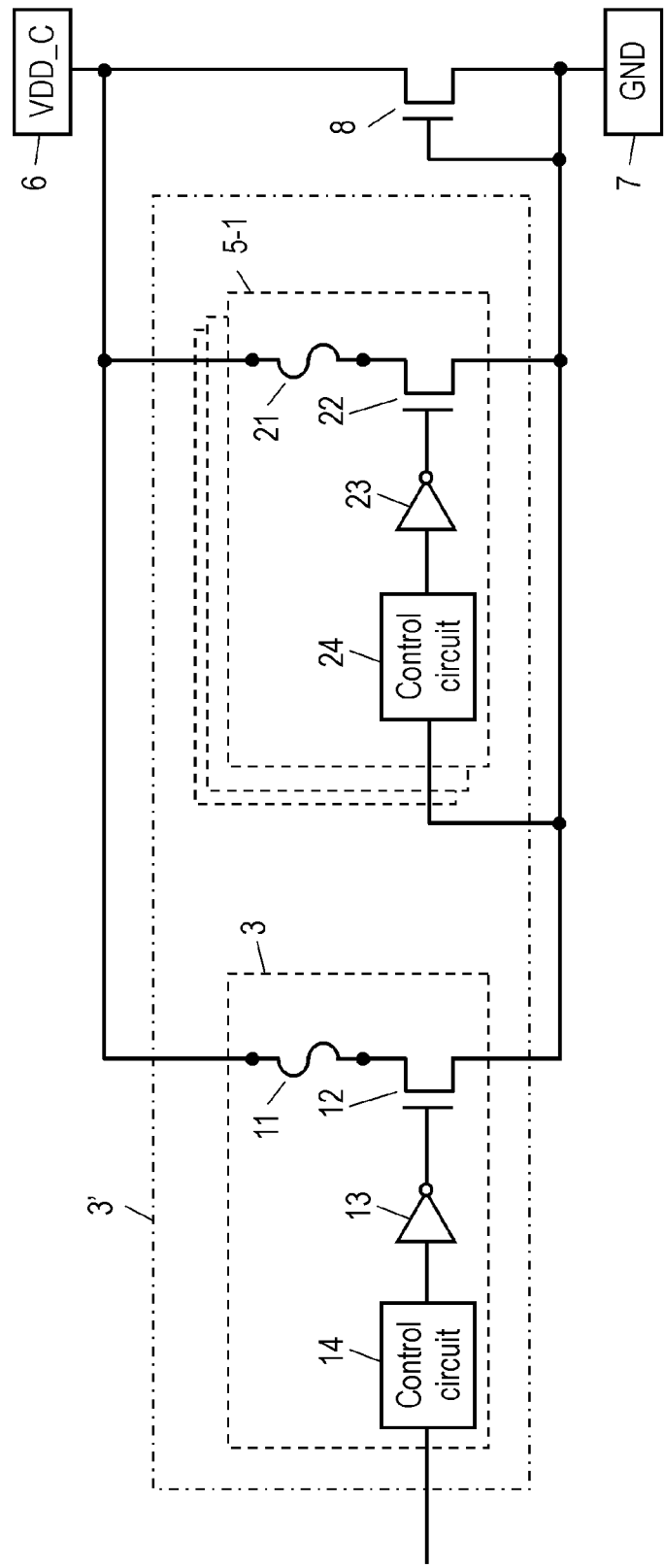
FIG. 8 shows an example of a circuit diagram including an electric fuse circuit and a program circuit shown in FIG. 7.

FIG. 7 is a plan view illustrating another structure of the system LSI in accordance with the embodiment. In the system LSI shown in FIG. 7, the program protective circuit is integrated into circuit block 3' to which the electric fuse circuit belongs. FIG. 8 shows an instance of circuit block 3' of the system LSI shown in FIG. 7. In FIG. 8, not to mention, the structure of circuit unit 5-1 can be changed to what is discussed previously as shown in FIG. 3-FIG. 6.

In the circuit structures previously discussed, NMOS transistors are disposed between the program power supply and the grounding in electric fuse circuit 3 and program preventive circuit 5, however, PMOS transistors can replace the NMOS transistors.

Figure 9:
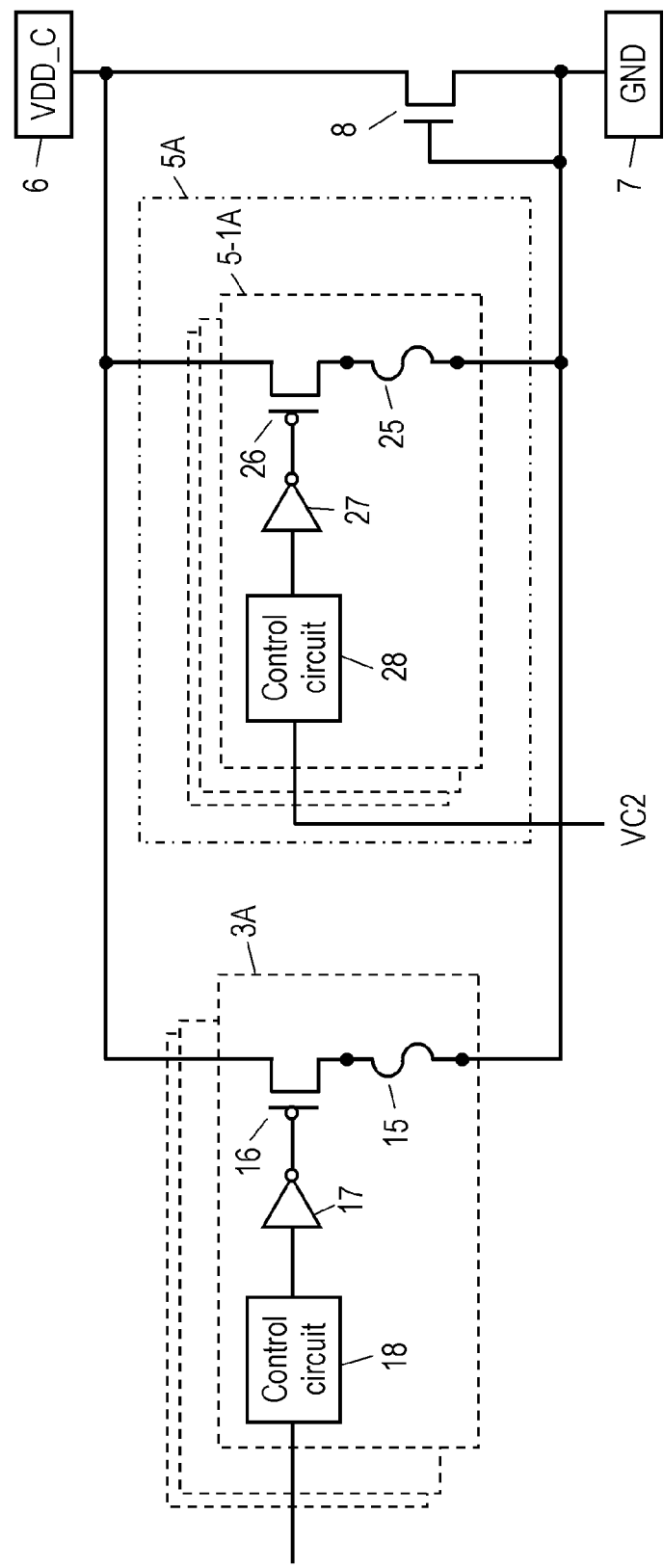
FIG. 9 shows a variation of the circuit diagram shown in FIG. 2.

FIG. 9 shows another example of the circuit diagram including electric fuse circuit 3 and program preventive circuit 5, and this example employs the PMOS transistors. As shown in FIG. 9, electric fuse circuit 3A comprises the following structural elements:

fuse element 15 and PMOS transistor 16 connected together in series and disposed between program power supply 6 and grounding 7;

inverter circuit 17 of which output is connected to a gate of PMOS transistor 16; and control circuit 18 for selecting fuse element 15 to be programmed.

Each of circuit units 5-1A of program protective circuit 5A comprises the following structural elements:

fuse element 25 and PMOS transistor 26 connected together in series and disposed between program power supply 26 and grounding 27;

inverter circuit 27 of which output is connected to a gate of PMOS transistor 26; and control circuit 28 having the same structure as control circuit 18.

The structure of circuit units 5-1A shown in FIG. 9 can be changed as circuit units 5-1 shown in FIGS. 4-6 are changed, and the program preventive circuit 5A can be integrated into the circuit block to which electric fuse circuit 3A belongs as is done in FIG. 8. Electric fuse circuit 3 can employ either one of the NMOS transistor or PMOS transistor, and program preventive circuit 5 can employ the remaining one.

Each one of NMOS transistor 8 shown in FIGS. 2-6, and FIG. 8 preferably employs a transistor of which gate has an oxide film thickness equal to those of NMOS transistors 12 and 22.

Other Examples of Layout

FIG. 10-FIG. 20 are plan views illustrating structures of system LSIs working as semiconductor devices in accordance with this embodiment. In FIG. 10-FIG. 20, similar structural elements to those in FIG. 1 have the same reference marks, and the detailed descriptions thereof are omitted here.

Each of the system LSIs shown in FIG. 10-FIG. 14 includes multiple electric fuse circuits 3 in an region (center region 8 in this embodiment) other than IO cell region 2, and the multiple fuse circuits 3 are disposed in the form of discrete blocks. To be more specific, two electric fuse circuits 3 are disposed near to program power supplying cell 6 and grounding cell 7 placed on the upper side of the chip, and four electric fuse circuits 3 are disposed near to program power supplying cell 6 and grounding cell 7 placed on the lower side of the chip.

Figure 10:
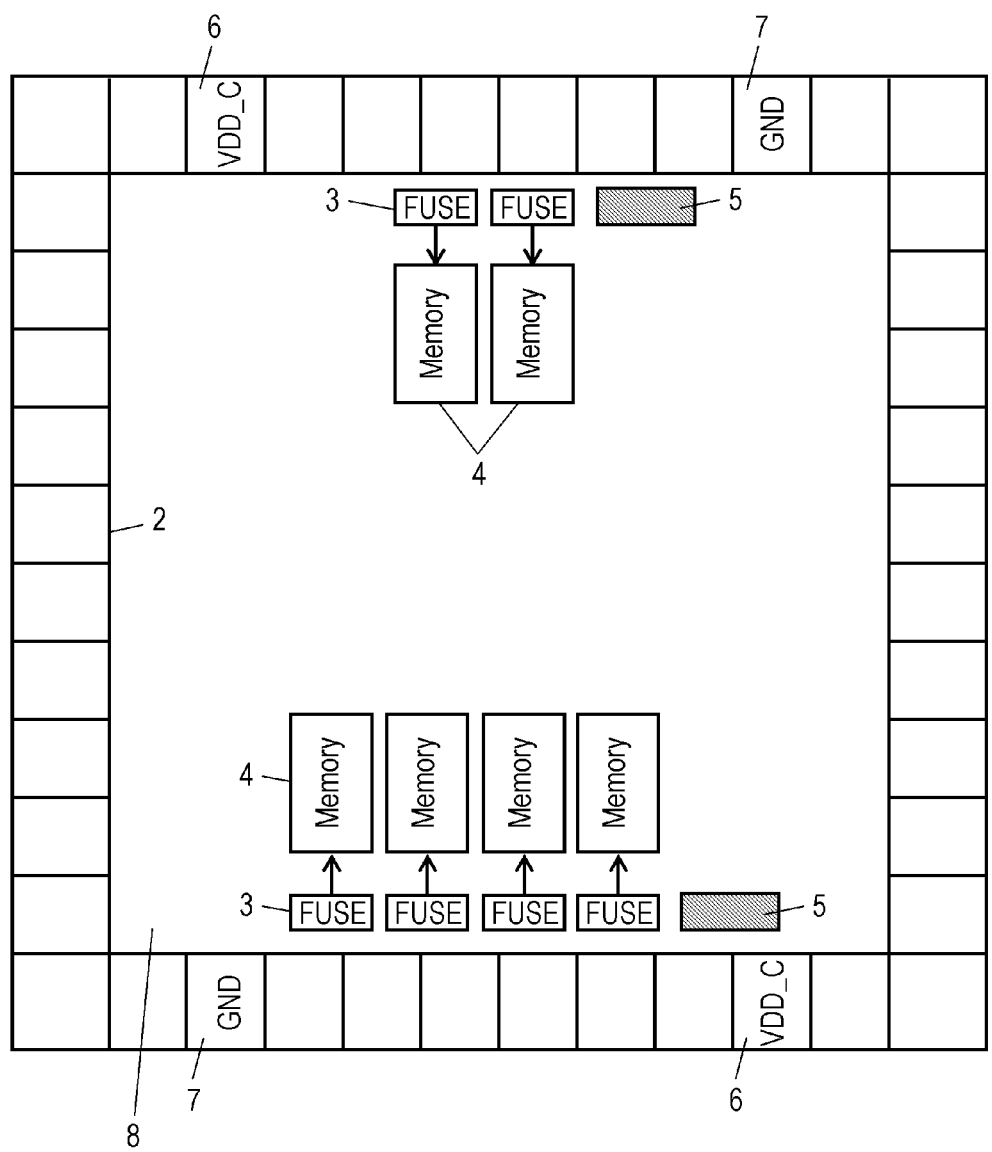
FIG. 10 is a plan view illustrating another structure of the semiconductor device in accordance with the embodiment.
Figure 11:
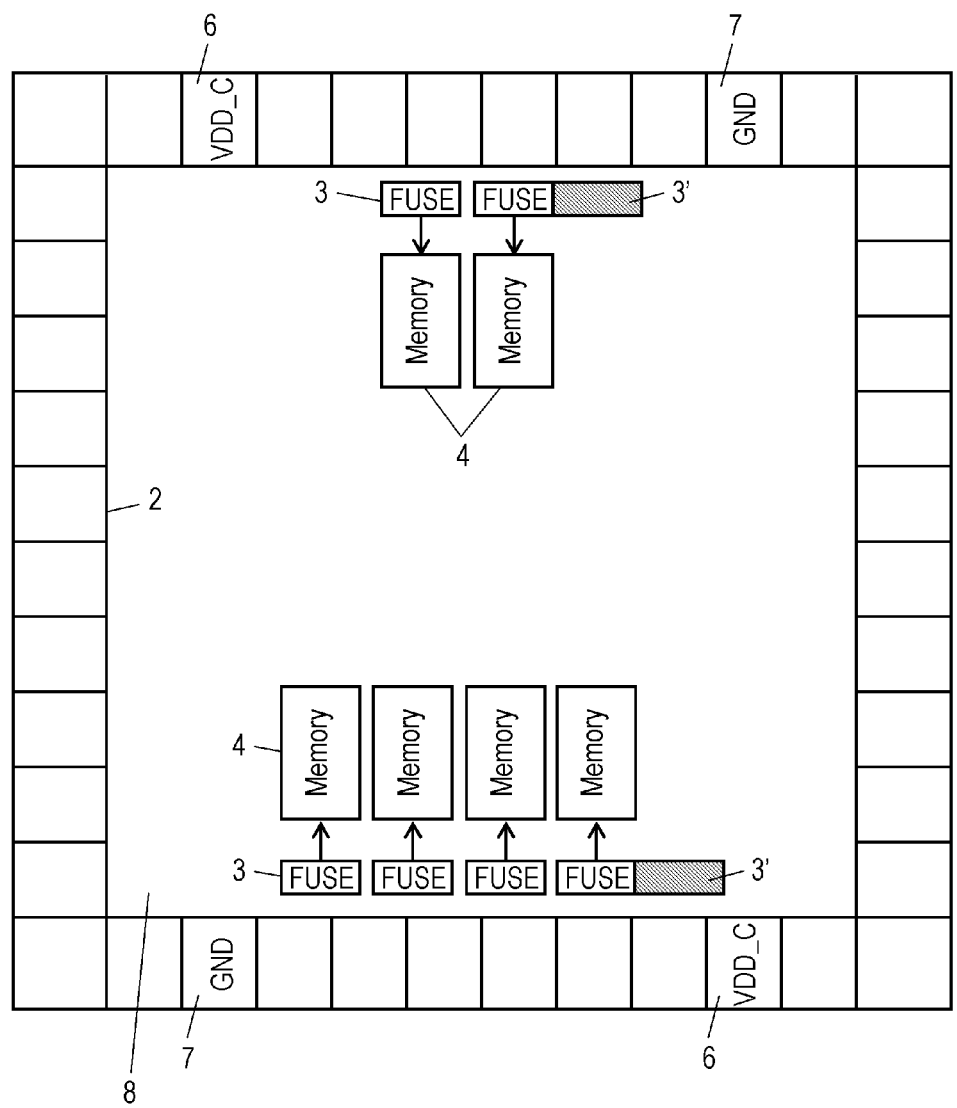
FIG. 11 is a plan view illustrating another structure of the semiconductor device in accordance with the embodiment.

The system LSI shown in FIG. 10 includes program protective circuits 5 disposed respectively adjacent to electric fuse circuits 3 in each location. As shown in FIG. 10, each one of electric fuse circuits 3 form an independent block of the block of program preventive circuit 5 while the system LSI shown in FIG. 11 integrates the program preventive circuit into circuit block 3' to which electric fuse circuit 3 belongs.

Figure 12:
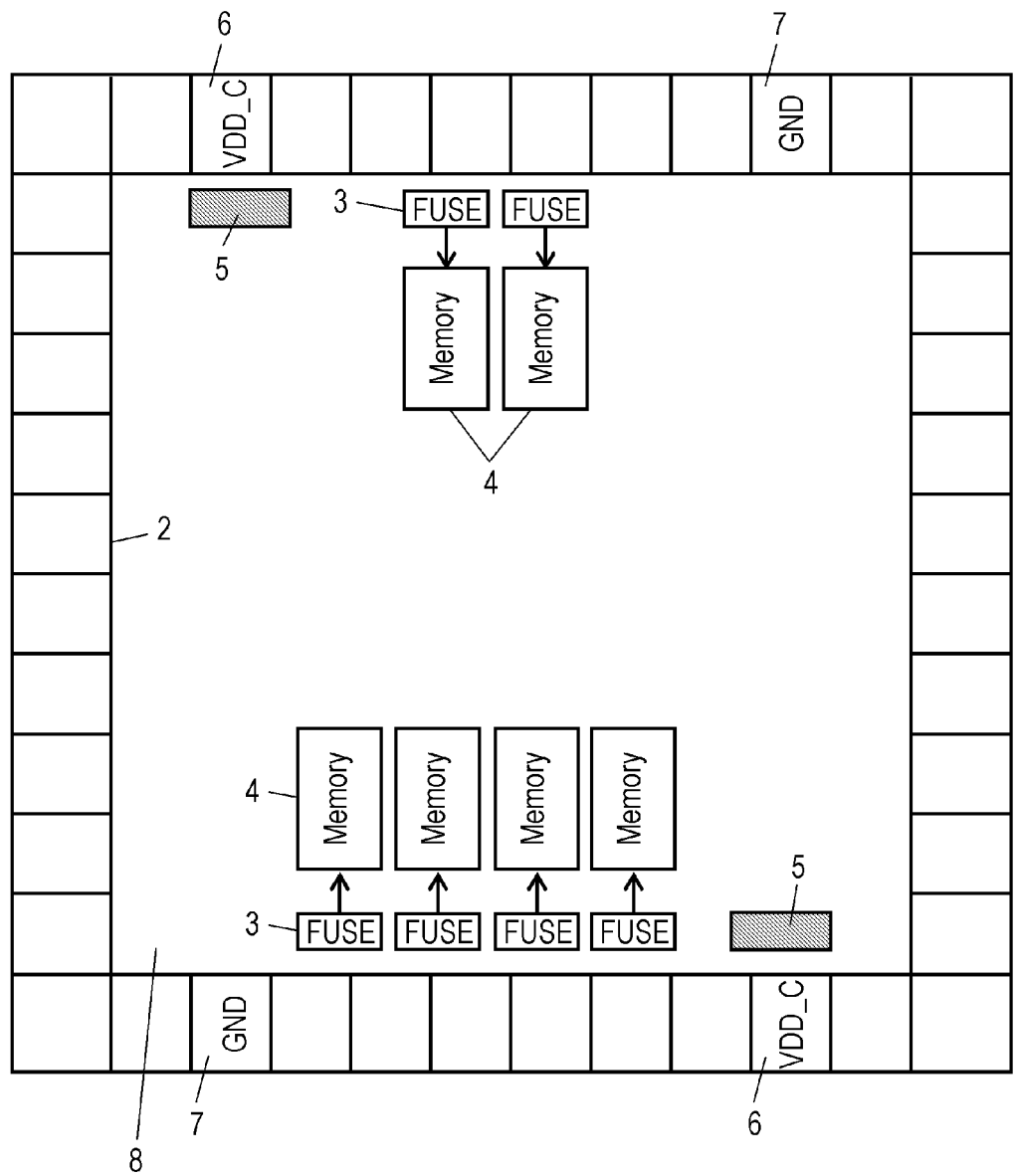
FIG. 12 is a plan view illustrating another structure of the semiconductor device in accordance with the embodiment.

The system LSI shown in FIG. 12 includes program preventive circuits 5 disposed near to program power supplying cells 6 with respect to each location of electric fuse circuits 3. The system LSI shown in FIG. 13 includes program preventive circuits 5 disposed near to grounding cells 7 with respect to each location of electric fuse circuits 3. The system LSI shown in FIG. 14 includes program preventive circuits 5 disposed near to either one of program power supplying cells 6 or grounding cells 7 with respect to each location of electric fuse circuits 3.

Figure 13:
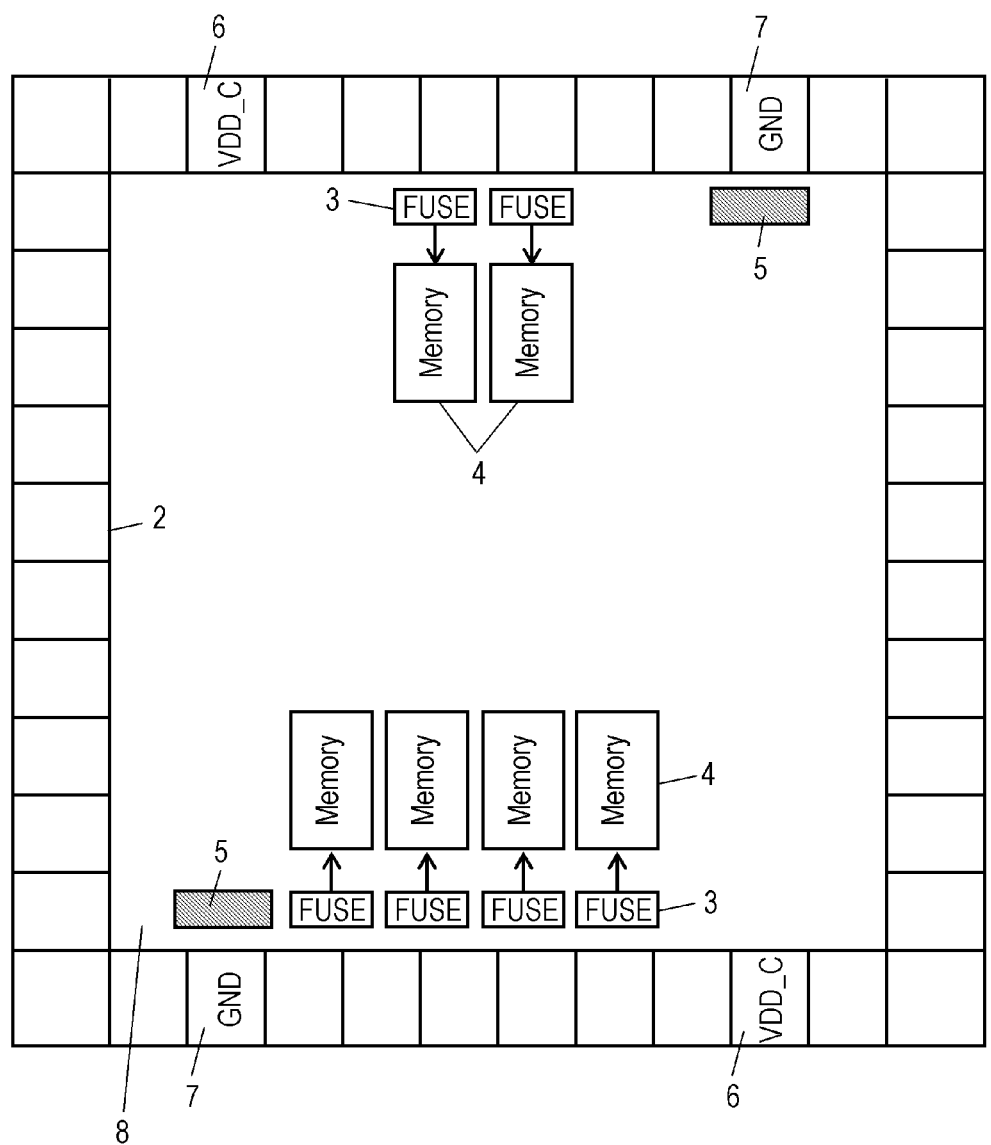
FIG. 13 is a plan view illustrating another structure of the semiconductor device in accordance with the embodiment.
Figure 14:
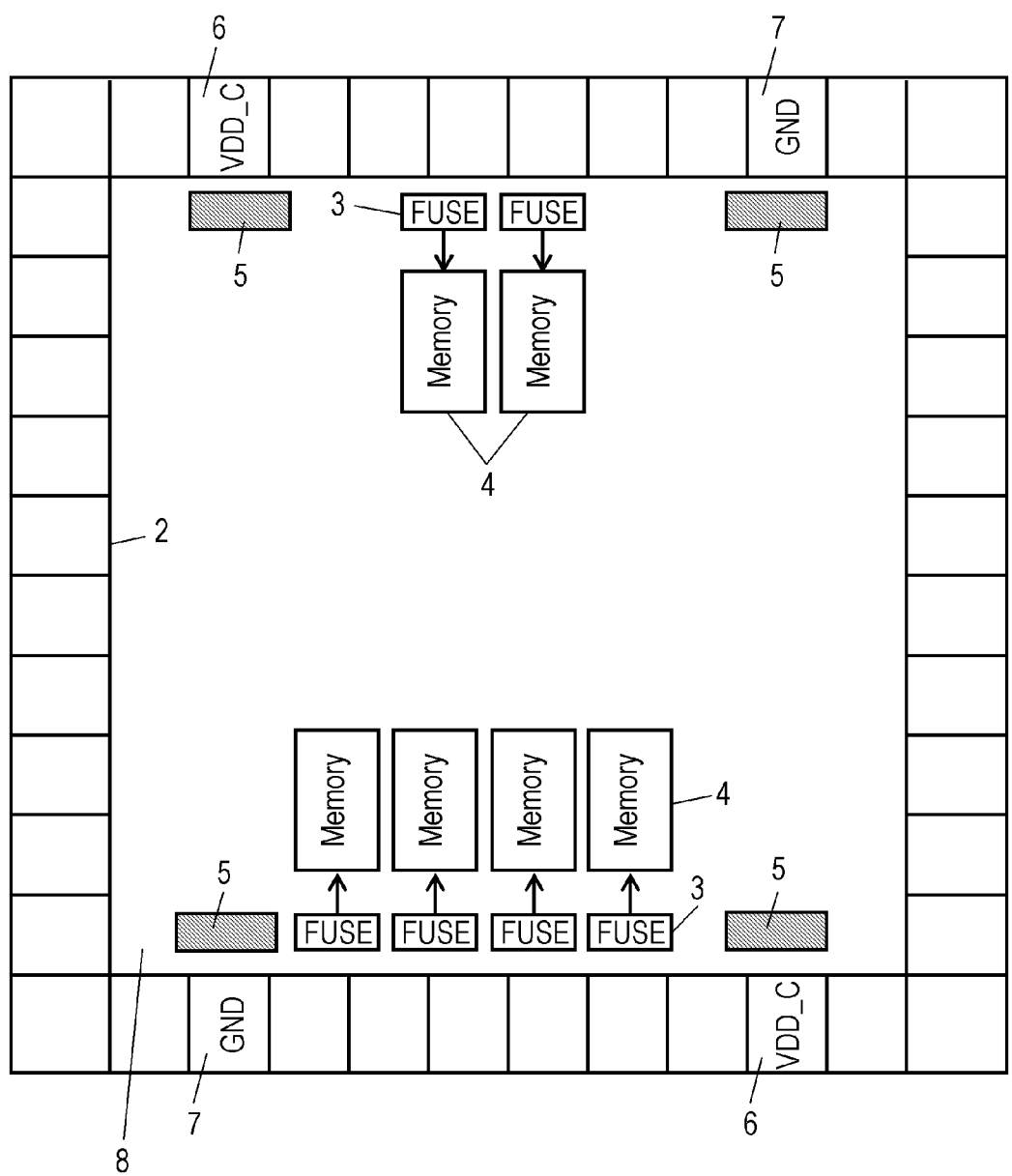
FIG. 14 is a plan view illustrating another structure of the semiconductor device in accordance with the embodiment.
Figure 15:
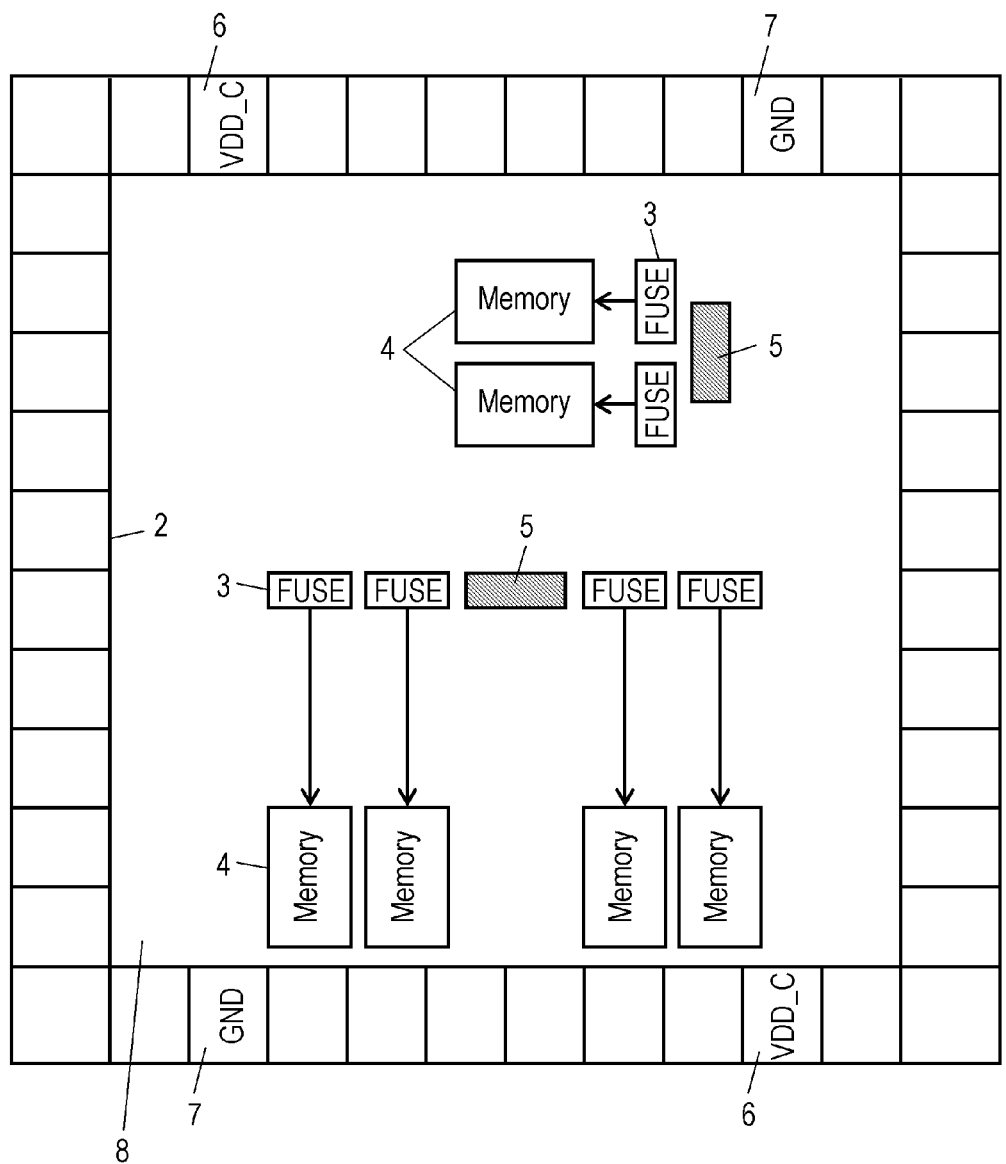
FIG. 15 is a plan view illustrating another structure of the semiconductor device in accordance with the embodiment.

As discussed above, the placement of program preventive circuits 5 in each location of electric fuse circuits 3 can prevent without fail the erroneous programming in applying the surge voltage. The surge current encounters a resistance in a current path, and the resistance varies depending on the layouts of program power supplying cells 6, grounding cells 7, and electric fuse circuits 3. However, as shown in FIG. 12-FIG. 14, the placement of program preventive circuit 5 near to program power supplying cell 4 and/or grounding cell 7, which are the base points of the current path for the surge current, allows obtaining, more effectively and regardless of the layout, the advantage of preventing the fuse element from being erroneously programmed.

The system LSIs shown in FIG. 10-FIG. 14 include electric fuse circuits 3 and program preventive circuits 5 disposed in center region 8 and near to IO cell region 2. On the other hand, the system LSI shown in FIG. 15 includes electric fuse circuits 3 and program preventive circuits 5 disposed in center region 8 at the center thereof and also disposed between the center and IO cell region 2.

Figure 16:
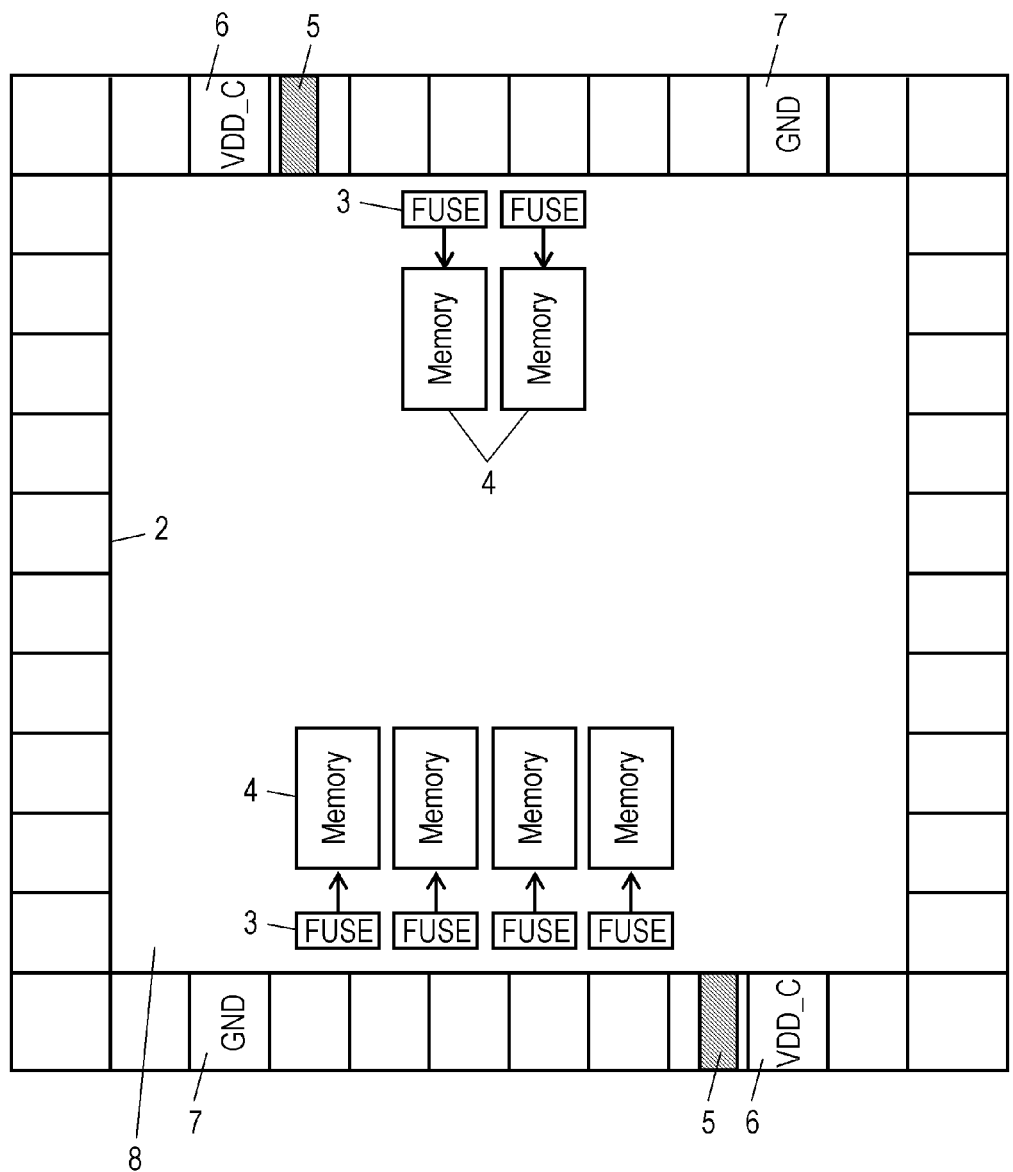
FIG. 16 is a plan view illustrating another structure of the semiconductor device in accordance with the embodiment.
Figure 17:
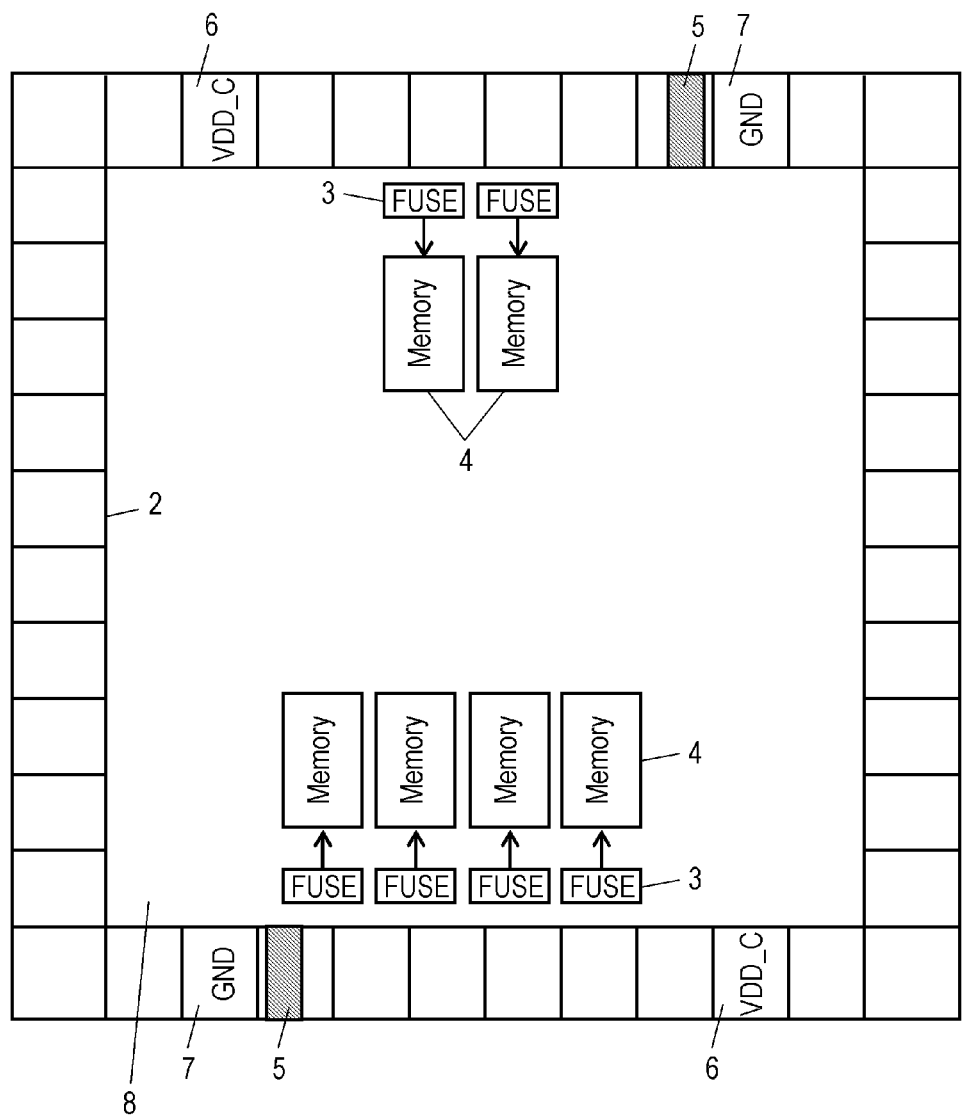
FIG. 17 is a plan view illustrating another structure of the semiconductor device in accordance with the embodiment.
Figure 18:
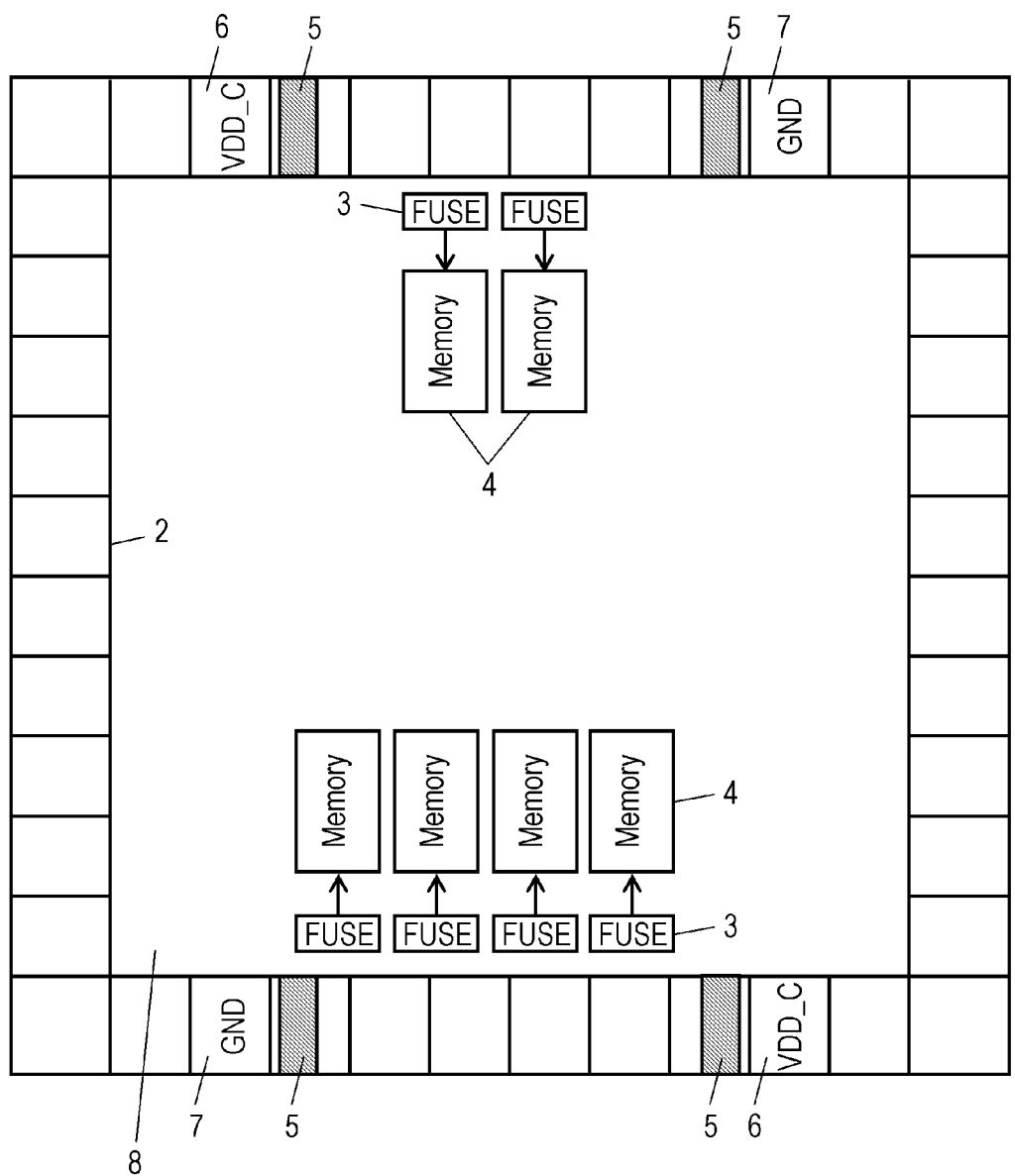
FIG. 18 is a plan view illustrating another structure of the semiconductor device in accordance with the embodiment.

The system LSIs shown in FIG. 16-FIG. 18 include multiple electric fuse circuits 3 disposed in discrete blocks in an region (center region 8 in this embodiment) other than IO cell region 2. To be more specific, two electric fuse circuits 3 are disposed near to program power supplying cell 6 and grounding cell 7 placed on the upper side of the chip, and four electric fuse circuits 3 are disposed near to program power supplying cell 6 and grounding cell 7 placed on the lower side of the chip.

The system LSIs shown in FIG. 16-FIG. 18 include program protective circuits 5 disposed in IO cell region 2 and between program power supplying cell 6 and grounding cell 7. The system LSI shown in FIG. 16 includes program protective circuits 5 disposed near to program power supplying cells 6 while the system LSI shown in FIG. 17 include program protective circuits 5 disposed near to grounding cells 7. The system LSI shown in FIG. 19 includes program preventive circuits 5 disposed near to either one of program power supplying cells 6 or grounding cells 7.

As discussed above, the placement of program protective circuits 5 within IO cell region 2 allows capitalizing on the regions other than IO cell region 2. The placement of program protective circuits 5 between program power supplying cells 6 and grounding cells 7 allows preventing more positively an erroneous programming at the application of the surge voltage. On top of that, the placement of program preventive circuits 5 near to program power supplying cell 4 and/or grounding cell 7, which are the base points of the current path for the surge current, allows obtaining, more effectively and regardless of the layout, the advantage of preventing the fuse element from being erroneously programmed.

Figure 19:
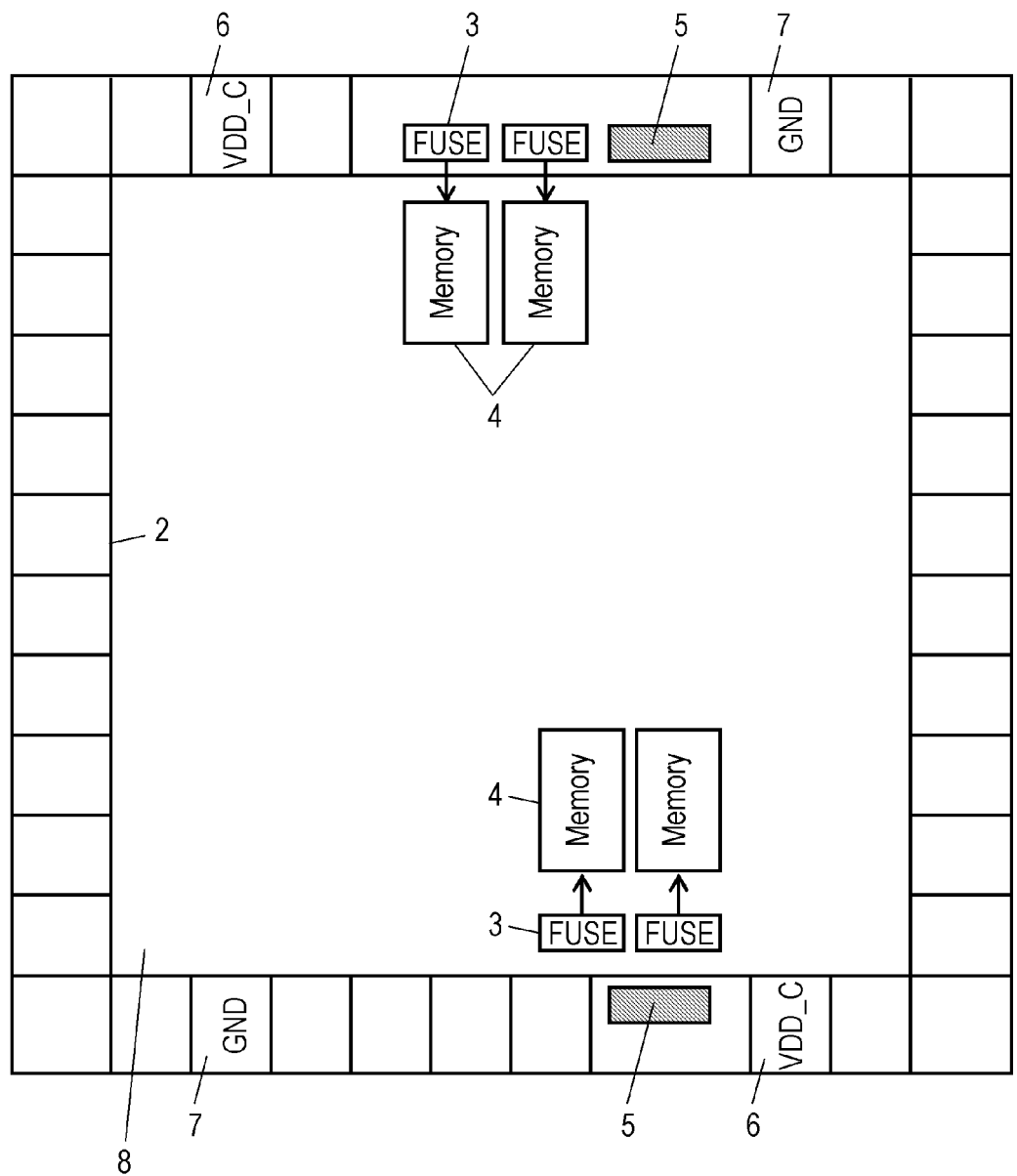
FIG. 19 is a plan view illustrating another structure of the semiconductor device in accordance with the embodiment.
Figure 20:
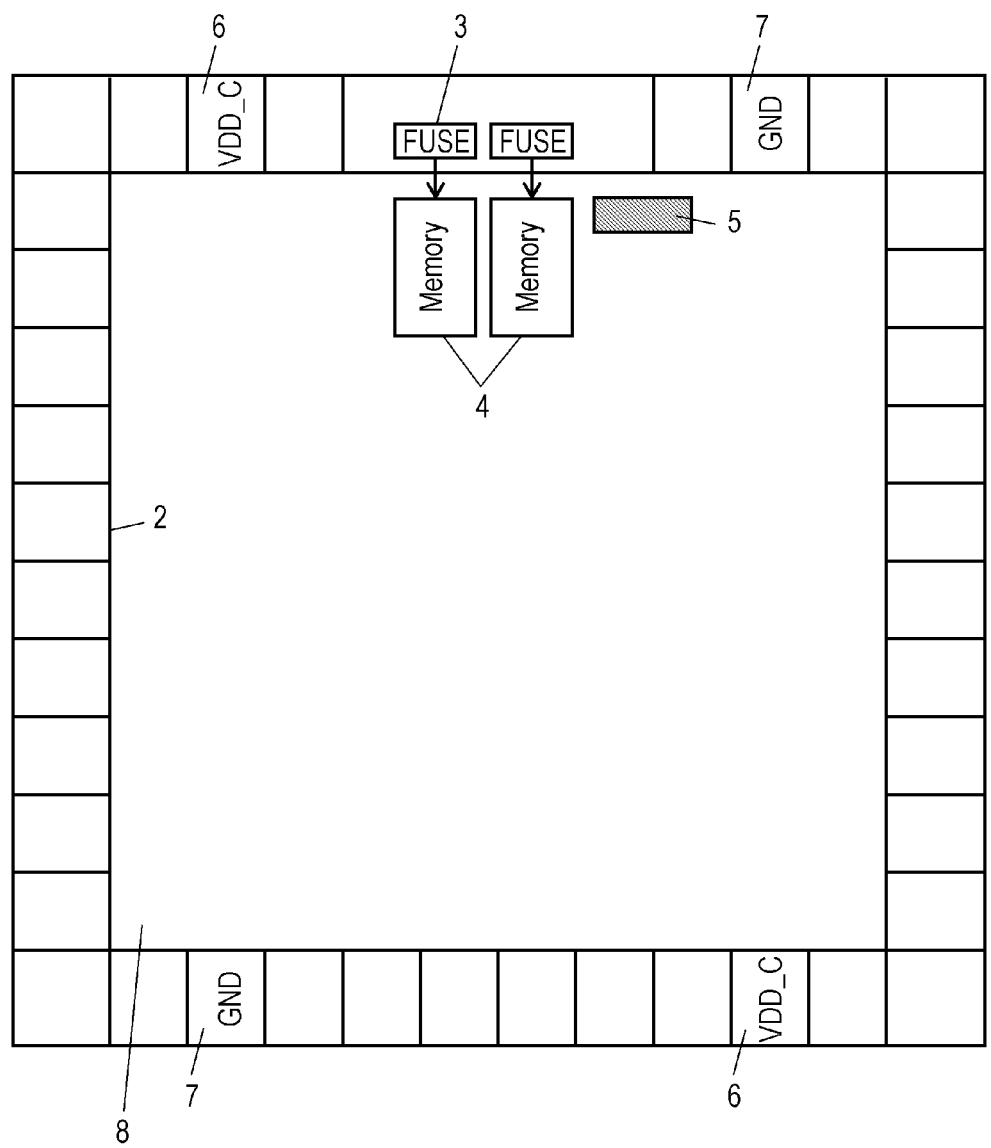
FIG. 20 is a plan view illustrating another structure of the semiconductor device in accordance with the embodiment.
Figure 21:
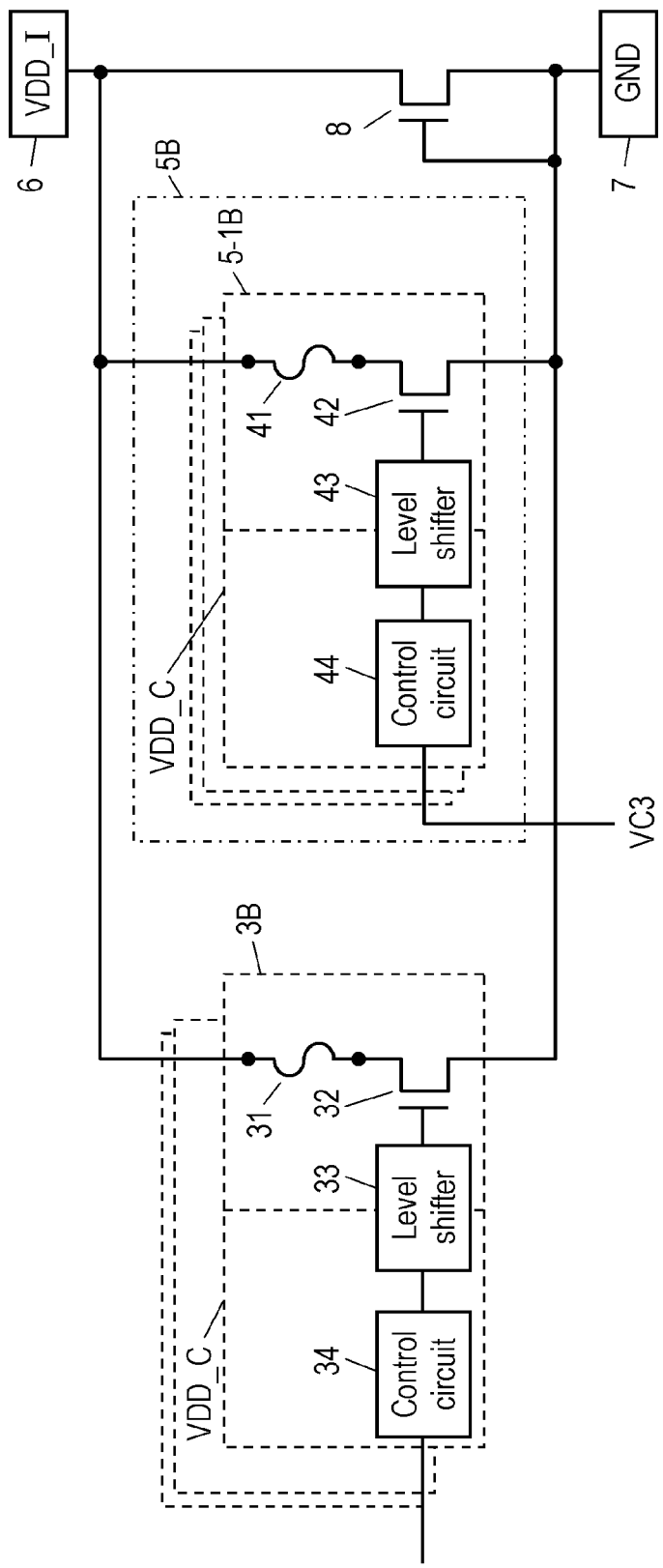
FIG. 21 shows another example of the circuit diagram including an electric fuse circuit and a program circuit.

The system LSI shown in FIG. 19 includes electric fuse circuit 3 and program protective circuit 5 both disposed within IO cell region 2 on the upper side of the chip, and its program protective circuit 5 only is disposed within IO cell region 2 in the lower side of the chip while its electric fuse circuit 3 is disposed in center region 8. The system LSI shown in FIG. 20 includes electric fuse circuit 3 in IO cell region 2 while its program protective circuit 5 is disposed in center region 8.

The structure of electric fuse circuit 3 in accordance with this embodiment is an example, and the present invention can be applied to another electric fuse circuit having a different structure.

FIG. 21-FIG. 24 show examples of circuit diagrams each one of which includes another electric fuse circuit and a counterpart program protective circuit. As shown in FIG. 21-FIG. 24, electric fuse circuit 3B comprises the following structural elements:

fuse element 31 and NMOS transistor 32 connected together in series and disposed between program power supply 6 and grounding 7;

level shifter 33 of which output is connected to a gate of NMOS transistor 32, and control circuit 34 for selecting fuse element 31 to be programmed.

Control circuit 34 is driven by logic-circuit power supply VDD_C different from program power supply VDD_I, and level shifter 33 changes an output voltage from lower potential VDD_C to high potential VDD_I, thereby supplying it to the gate of NMOS transistor 32. The controlling section is formed of control circuit 34 and level shifter 33.

Each of circuit units 5-1B included in program protective circuit 5B comprises the following structural elements:

fuse element 41 working as a second fuse element and NMOS transistor 42 working as a second transistor connected together in series and disposed between program power supply 6 and grounding 7;

level shifter 43 of which output is connected to a gate of NMOS transistor 42; and control circuit 44 having the same structure as control circuit 34.

A given potential VC3 is supplied to control circuit 44 such that an output from level shifter 43 can be set at the potential that throws NMOS transistor 42 into an off-state. A second controlling section is formed of control circuit 44 and level shifter 43.

Figure 22:
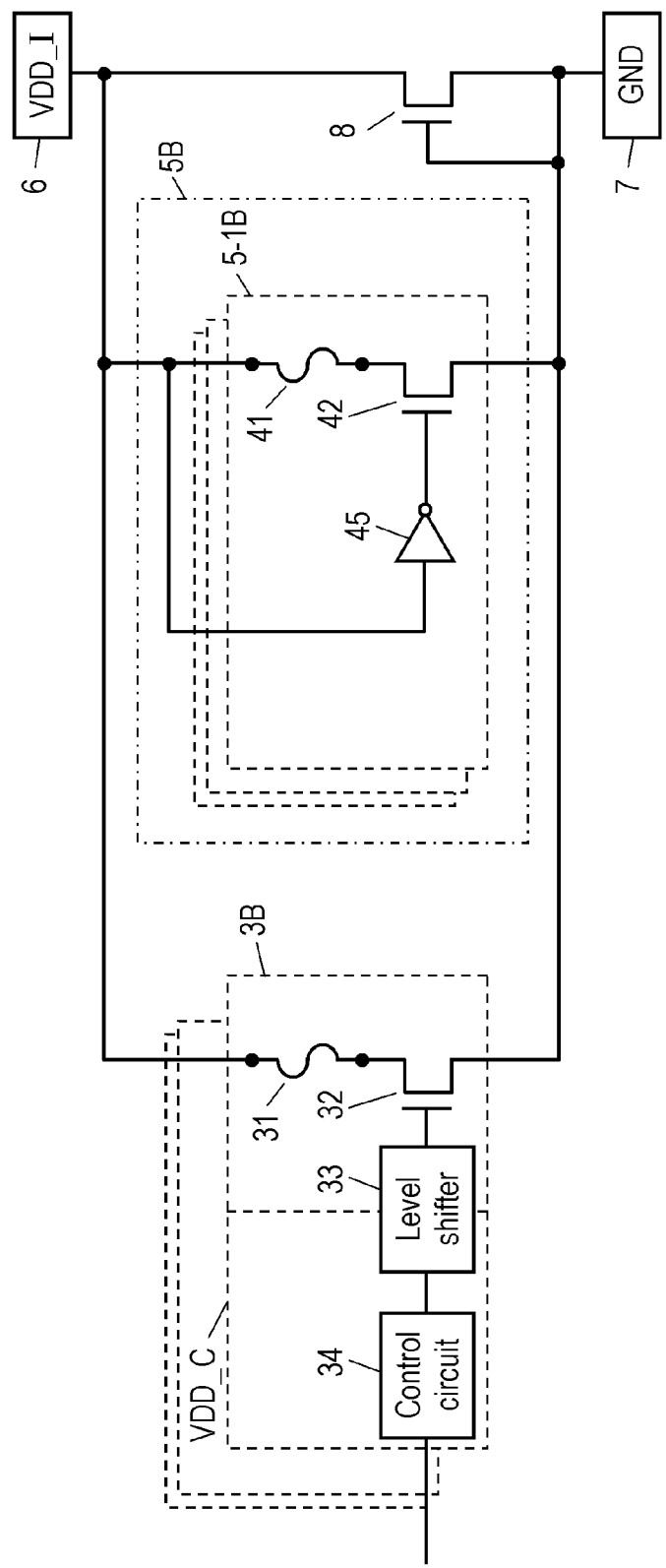
FIG. 22 shows another example of the circuit diagram including an electric fuse circuit and a program circuit.

In FIG. 22, control circuit 44 and level shifter 43 are omitted from circuit unit 5-1B, and inverter circuit 45 replaces them. Source voltage VDD_I of the program power supply is input to inverter circuit 45 such that inverter circuit 45 can supply a potential to the gate of NMOS transistor 42 for maintaining transistor 42 in the off-state.

Figure 23:
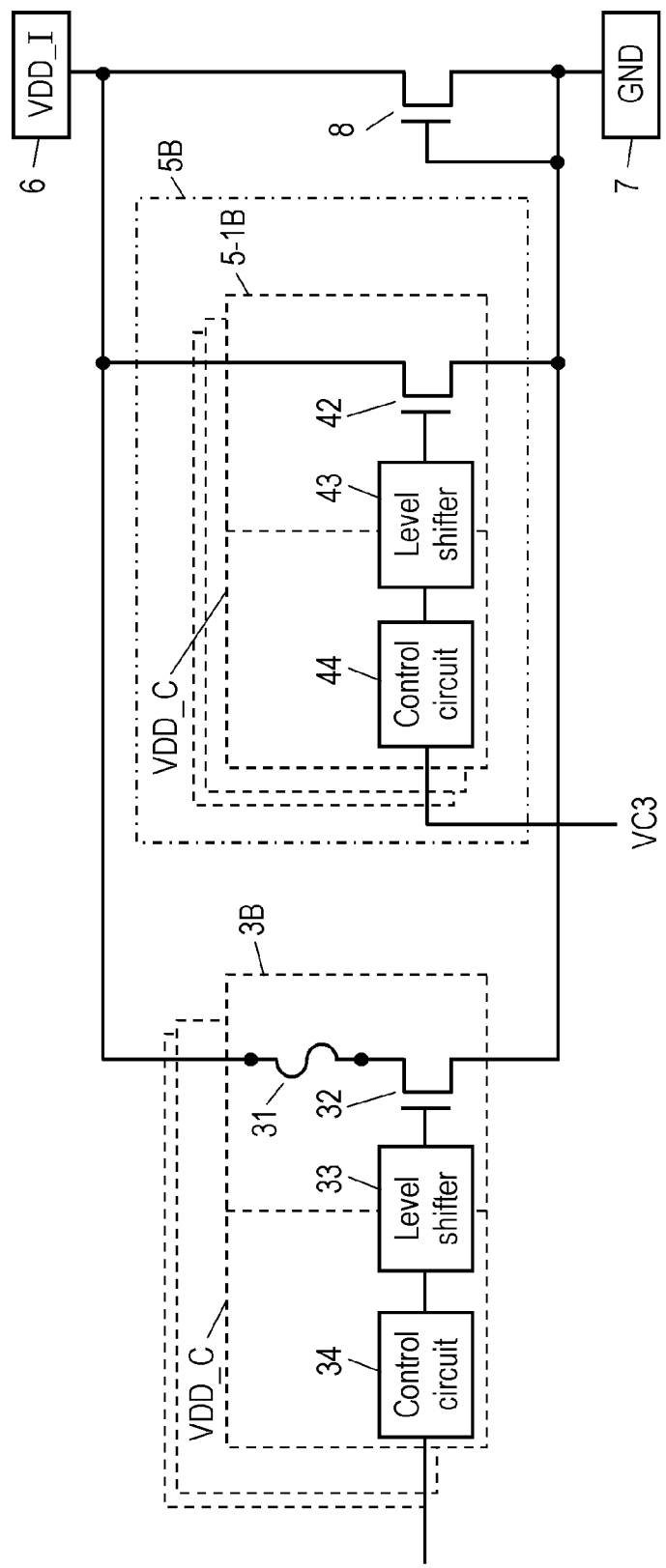
FIG. 23 shows another example of the circuit diagram including an electric fuse circuit and a program circuit.
Figure 24:
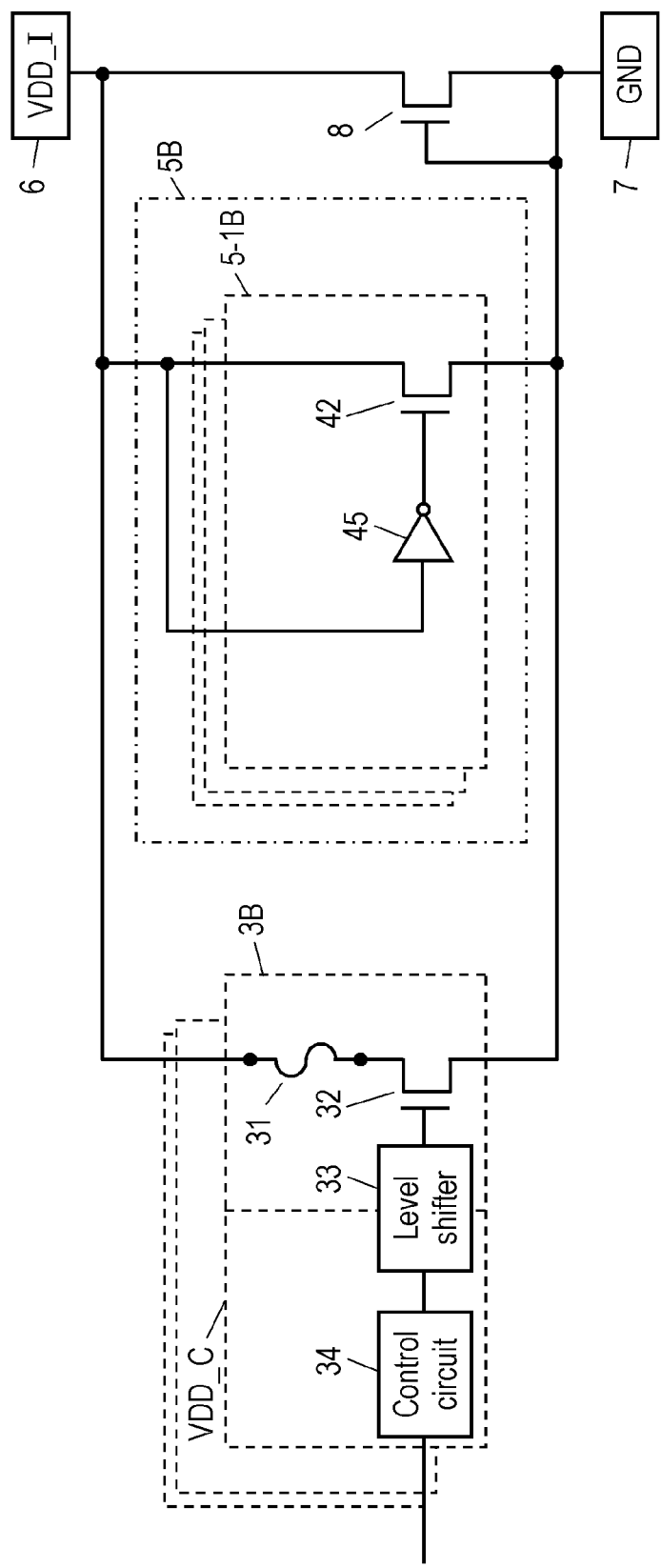
FIG. 24 shows another example of the circuit diagram including an electric fuse circuit and a program circuit.

In FIG. 23, fuse element 41 is omitted from circuit unit 5-1B. In FIG. 24, control circuit 44, level shifter 43 and fuse element 41 are omitted from circuit unit 5-1B, and inverter circuit 45 is provided instead. Source voltage VDD_I of the program power supply is input to inverter circuit 45 such that inverter circuit 45 can supply a potential to the gate of NMOS transistor 42 for maintaining transistor 42 in an off-state.

Each one of NMOS transistors 8 shown in FIG. 21-FIG. 24 preferably employs a transistor of which gate has an oxide film thickness equal to that of NMOS transistors 32 and 42. In FIG. 21-FIG. 24, source voltage VDD_I is, in general, higher than source voltage VDD_C, so that the film thickness of transistors 32, 42 is, in general, greater than those of the logic transistors forming control circuits 34, 44. Transistor 8 also has, in general, a greater film thickness than that of the logic transistor.

The semiconductor device of the present invention is not limited to the system LSI including an IO cell region disposed in periphery thereof as shown in the accompanying drawings. The electric fuse circuit is not limited to be used as a redundant device for failure relief of a memory.

The semiconductor device of the present invention avoids an erroneous programming on a fuse element even if a program power supply applies a surge voltage thereto. The semiconductor is thus useful for reducing the cost or improving the quality of set-products.

What is claimed is:
1. A semiconductor device comprising:
an electric fuse circuit including a fuse element and a transistor connected together in series and disposed between a program power supply and a grounding, and a controlling section for controlling a gate potential of the transistor; and
a program protective circuit connected in parallel with the electric fuse circuit and disposed between the program power supply and the grounding, wherein a part of a surge current flows through the program protective circuit when a surge voltage is applied between the program power supply and the grounding,
wherein the program protective circuit includes a resistance element and a second transistor connected together in series and disposed between the program power supply and the grounding.

2. The semiconductor device of claim 1, wherein the resistance element is a second fuse element.

3. The semiconductor device of claim 2 includes at least 10 pairs of the second fuse element and the second transistor connected together in series.

4. The semiconductor device of claim 2, wherein the fuse element and the second fuse element are made of the same material and have the same structure.

5. The semiconductor device of claim 1, wherein the program protective circuit includes a second controlling section for controlling a potential at a gate of the second transistor, and
wherein the second controlling section is formed identically to the controlling section of the electric fuse circuit, and is set such that the second controlling section can supply a potential to the gate of the second transistor for throwing the second transistor into a non-conductive state.

6. The semiconductor device of claim 1, wherein the program protective circuit is set such that it can supply a potential to a gate of the second transistor for throwing the second transistor into a non-conductive state.

7. The semiconductor device of claim 1, wherein a size of the second transistor is equal to or greater than that of the transistor.

8. The semiconductor device of claim 1, wherein the second transistor has a threshold equal to or smaller than that of the transistor.

9. The semiconductor device of claim 2, wherein the program protective circuit forms a circuit block independent of the electric fuse circuit.

10. The semiconductor device of claim 2, wherein the program protective circuit is integrated into a circuit block to which the electric fuse circuit belongs.

11. The semiconductor device of claim 2, wherein a program power supplying cell and a grounding cell are disposed in an IO cell region, and a plurality of the electric fuse circuits are disposed near to the program power supplying cell and the grounding cell.

12. The semiconductor device of claim 11, wherein the program protective circuit is disposed outside the IO cell region and adjacently to the plurality of the electric fuse circuits.

13. The semiconductor device of claim 11, wherein the program protective circuit is disposed outside the IO cell region and integrated into one of the plurality of the electric fuse circuits.

14. The semiconductor device of claim 11, wherein the program protective circuit is disposed outside the IC cell region and near to at least one of the program power supplying cell and the grounding cell.

15. The semiconductor device of claim 11, wherein the program protective circuit is disposed in the IO cell region and between the program power supplying cell and the grounding cell.

16. The semiconductor device of claim 15, wherein the program protective circuit is disposed in the IO cell region and near to at least one of the program power supplying cell or the grounding cell.

17. The semiconductor device of claim 2, wherein a program power supplying cell and a grounding cell are disposed in an IO cell region that is disposed on a periphery of a chip forming the semiconductor device, and a plurality of the electric fuse circuits is disposed in a center region surrounded by the IO cell region.

18. The semiconductor device of claim 17, wherein the program protective circuit is disposed in the center region and adjacently to the plurality of the electric fuse circuits.

19. The semiconductor device of claim 17, wherein the program protective circuit is integrated in one of the plurality of the electric fuse circuits in the center region.

20. The semiconductor device of claim 17, wherein the program protective circuit is disposed in the center region and near to at least one of the program power supplying cell and the grounding cell.

21. The semiconductor device of claim 17, wherein the program protective circuit is disposed in the IO cell region and between the program power supplying cell and the grounding cell.

22. The semiconductor device of claim 21, wherein the program protective circuit is disposed in the IO cell region and near to at least one of the program power supplying cell and the grounding cell.

23. The semiconductor device of claim 11, wherein the IO cell region is disposed on a periphery of a chip forming the semiconductor device, and the program protective circuit is disposed in a center region surrounded by the IO cell region.

24. The semiconductor device of claim 23, wherein the program protective circuit is disposed in the center region and adjacently to the plurality of the electric fuse circuits.

25. The semiconductor device of claim 23, wherein the program protective circuit is integrated in one of the plurality of the electric fuse circuits in the center region.

26. The semiconductor device of claim 23, wherein the program protective circuit is disposed in the center region and near to at least one of the program power supplying cell and the grounding cell.

27. A semiconductor device comprising:
an electric fuse circuit including a fuse element and a transistor connected together in series and disposed between a program power supply and a grounding, and a controlling section for controlling a gate potential of the transistor; and
a program protective circuit connected in parallel with the electric fuse circuit and disposed between the program power supply and the grounding, wherein a part of a surge current flows through the program protective circuit when a surge voltage is applied between the program power supply and the grounding,
wherein the program protective circuit includes a second transistor but no fuse element between the program power supply and the grounding.

* * * * *